US007652342B2

(12) United States Patent
Bertin

(10) Patent No.: US 7,652,342 B2
(45) Date of Patent: Jan. 26, 2010

(54) NANOTUBE-BASED TRANSFER DEVICES AND RELATED CIRCUITS

(75) Inventor: Claude L. Bertin, Burlington, VT (US)

(73) Assignee: Nantero, Inc., Woburn, MA (US)

( * ) Notice: Subject to any disclaimer, the term of this patent is extended or adjusted under 35 U.S.C. 154(b) by 172 days.

(21) Appl. No.: 11/033,087

(22) Filed: Jan. 10, 2005

(65) Prior Publication Data

US 2005/0279988 A1     Dec. 22, 2005

Related U.S. Application Data

(60) Provisional application No. 60/580,799, filed on Jun. 18, 2004.

(51) Int. Cl.
H01L 23/58     (2006.01)
(52) U.S. Cl. .............................. 257/415; 257/E23.147; 257/E23.149
(58) Field of Classification Search ......... 257/414–420, 257/E23.147, E23.149; 438/50, 52
See application file for complete search history.

(56) References Cited

U.S. PATENT DOCUMENTS

| | | | |
|---|---|---|---|
| 5,414,654 | A | 5/1995 | Kubota et al. |
| 5,682,345 | A | 10/1997 | Roohparvar et al. |
| 5,818,748 | A | 10/1998 | Bertin et al. |
| 6,097,241 | A | 8/2000 | Bertin et al. |
| 6,097,243 | A | 8/2000 | Bertin et al. |
| 6,128,214 | A | 10/2000 | Kuekes et al. |
| 6,136,160 | A | 10/2000 | Hrkut et al. |
| 6,159,620 | A | 12/2000 | Heath et al. |
| 6,198,655 | B1 | 3/2001 | Heath et al. |
| 6,232,706 | B1 | 5/2001 | Dai et al. |
| 6,256,767 | B1 | 7/2001 | Kuekes et al. |
| 6,314,019 | B1 | 11/2001 | Kuekes et al. |
| 6,345,362 | B1 | 2/2002 | Bertin et al. |
| 6,346,846 | B1 | 2/2002 | Bertin et al. |
| 6,353,552 | B2 | 3/2002 | Sample et al. |

(Continued)

FOREIGN PATENT DOCUMENTS

GB     2 364 933     2/2002

(Continued)

OTHER PUBLICATIONS

Ajayan, P.M., et al., "Nanometre-size tubes of carbon," Rep. Prog. Phys., 1997, vol. 60, pp. 1025-1062.

(Continued)

*Primary Examiner*—Douglas M Menz
*Assistant Examiner*—Matthew W Such
(74) *Attorney, Agent, or Firm*—Wilmer Cutler Pickering Hale and Dorr LLP

(57) ABSTRACT

Nanotube transfer devices controllably form a nanotube-based electrically conductive channel between a first node and a second node under the control of a control structure. A control structure induces a nanotube channel element to deflect so as to form and unform the conductive channel between the nodes. The nanotube channel element is not in permanent electrical contact with either the first node or the second node. The nanotube channel element may have a floating potential in certain states of the device. Each output node may be connected to an arbitrary network of electrical components. The nanotube transfer device may be volatile or non-volatile. In preferred embodiments, the nanotube transfer device is a three-terminal device or a four-terminal device. Electrical circuits are provided that ensure proper switching of nanotube transfer devices interconnected with arbitrary circuits. The circuits may overdrive the control structure to induce the desired state of channel formation.

20 Claims, 12 Drawing Sheets

U.S. PATENT DOCUMENTS

| | | |
|---|---|---|
| 6,373,771 B1 | 4/2002 | Fifield et al. |
| 6,423,583 B1 | 7/2002 | Avouris et al. |
| 6,426,687 B1 * | 7/2002 | Osborn ................... 333/262 |
| 6,445,006 B1 * | 9/2002 | Brandes et al. ............ 257/76 |
| 6,515,339 B2 | 2/2003 | Shin et al. |
| 6,518,156 B1 | 2/2003 | Chen |
| 6,528,020 B1 | 3/2003 | Dai et al. |
| 6,548,841 B2 | 4/2003 | Frazier et al. |
| 6,559,468 B1 | 5/2003 | Kuekes et al. |
| 6,574,130 B2 | 6/2003 | Segal et al. |
| 6,625,047 B2 | 9/2003 | Coleman, Jr. |
| 6,625,740 B1 | 9/2003 | Datar et al. |
| 6,643,165 B2 | 11/2003 | Segal et al. |
| 6,661,270 B2 | 12/2003 | Nagata |
| 6,673,424 B1 | 1/2004 | Lindsay |
| 6,706,402 B2 | 3/2004 | Rueckes et al. |
| 6,707,098 B2 | 3/2004 | Hofmann et al. |
| 6,713,695 B2 * | 3/2004 | Kawai et al. .............. 200/181 |
| 6,750,471 B2 | 6/2004 | Bethune et al. |
| 6,759,693 B2 | 7/2004 | Vogeli et al. |
| 6,774,052 B2 | 8/2004 | Vogeli et al. |
| 6,781,166 B2 | 8/2004 | Lieber et al. |
| 6,784,028 B2 | 8/2004 | Rueckes et al. |
| 6,794,914 B2 | 9/2004 | Sani et al. |
| 6,803,840 B2 | 10/2004 | Kowalcyk et al. |
| 6,809,462 B2 | 10/2004 | Pelrine et al. |
| 6,809,465 B2 | 10/2004 | Jin |
| 6,835,591 B2 | 12/2004 | Rueckes et al. |
| 6,836,424 B2 | 12/2004 | Brock et al. |
| 6,918,284 B2 | 7/2005 | Snow et al. |
| 6,919,592 B2 | 7/2005 | Segal et al. |
| 6,919,740 B2 | 7/2005 | Snider |
| 6,955,937 B1 | 10/2005 | Burke et al. |
| 6,968,486 B2 | 11/2005 | Matsushima |
| 6,969,651 B1 * | 11/2005 | Lu et al. ................. 438/257 |
| 6,986,962 B2 | 1/2006 | Oyanagi et al. |
| 6,990,009 B2 * | 1/2006 | Bertin et al. ............. 365/151 |
| 7,015,500 B2 | 3/2006 | Choi et al. |
| 7,054,194 B2 | 5/2006 | Liaw et al. |
| 7,115,901 B2 | 10/2006 | Bertin et al. |
| 7,115,960 B2 | 10/2006 | Bertin et al. |
| 7,161,403 B2 | 1/2007 | Bertin |
| 7,288,970 B2 * | 10/2007 | Bertin ..................... 326/120 |
| 7,289,357 B2 * | 10/2007 | Bertin et al. ............. 365/166 |
| 2001/0023986 A1 | 9/2001 | Mancevski |
| 2002/0050882 A1 * | 5/2002 | Hyman et al. .............. 335/78 |
| 2002/0097136 A1 * | 7/2002 | Coleman et al. .......... 337/365 |
| 2002/0130353 A1 | 9/2002 | Lieber et al. |
| 2002/0172963 A1 | 11/2002 | Kelley et al. |
| 2002/0173083 A1 | 11/2002 | Avouris et al. |
| 2002/0175390 A1 | 11/2002 | Goldstein et al. |
| 2002/0179434 A1 | 12/2002 | Dai et al. |
| 2003/0021141 A1 | 1/2003 | Segal et al. |
| 2003/0021966 A1 | 1/2003 | Segal et al. |
| 2003/0022428 A1 * | 1/2003 | Segal et al. .............. 438/209 |
| 2003/0124325 A1 | 7/2003 | Rueckes et al. |
| 2003/0124837 A1 * | 7/2003 | Rueckes et al. ........... 438/629 |
| 2003/0132823 A1 | 7/2003 | Hyman et al. |
| 2003/0165074 A1 | 9/2003 | Segal et al. |
| 2003/0177450 A1 | 9/2003 | Nugent |
| 2003/0199172 A1 | 10/2003 | Rueckes et al. |
| 2003/0200521 A1 | 10/2003 | DeHon et al. |
| 2003/0206436 A1 | 11/2003 | Eaton et al. |
| 2003/0234407 A1 | 12/2003 | Vogeli et al. |
| 2003/0236000 A1 | 12/2003 | Vogeli et al. |
| 2004/0023514 A1 | 2/2004 | Moriya et al. |
| 2004/0031975 A1 | 2/2004 | Kern et al. |
| 2004/0041154 A1 | 3/2004 | Watanabe et al. |
| 2004/0075125 A1 | 4/2004 | Asao |
| 2004/0075159 A1 | 4/2004 | Vogeli |
| 2004/0077107 A1 | 4/2004 | Vogeli |
| 2004/0085805 A1 | 5/2004 | Segal et al. |
| 2004/0087162 A1 | 5/2004 | Vogeli |
| 2004/0104129 A1 | 6/2004 | Gu et al. |
| 2004/0159833 A1 | 8/2004 | Rueckes et al. |
| 2004/0164289 A1 | 8/2004 | Rueckes et al. |
| 2004/0175856 A1 | 9/2004 | Jaiprakash et al. |
| 2004/0181630 A1 | 9/2004 | Jaiprakash et al. |
| 2004/0191978 A1 | 9/2004 | Rueckes et al. |
| 2004/0214366 A1 | 10/2004 | Segal et al. |
| 2004/0214367 A1 | 10/2004 | Segal et al. |
| 2004/0238907 A1 * | 12/2004 | Pinkerton et al. .......... 257/419 |
| 2005/0035344 A1 | 2/2005 | Bertin et al. |
| 2005/0035367 A1 | 2/2005 | Bertin et al. |
| 2005/0035786 A1 | 2/2005 | Bertin et al. |
| 2005/0035787 A1 | 2/2005 | Bertin et al. |
| 2005/0036365 A1 | 2/2005 | Bertin et al. |
| 2005/0037547 A1 | 2/2005 | Bertin et al. |
| 2005/0041465 A1 | 2/2005 | Rueckes et al. |
| 2005/0041466 A1 | 2/2005 | Rueckes et al. |
| 2005/0047244 A1 | 3/2005 | Rueckes et al. |
| 2005/0052894 A1 | 3/2005 | Segal et al. |
| 2005/0053525 A1 | 3/2005 | Segal et al. |
| 2005/0056825 A1 | 3/2005 | Bertin et al. |
| 2005/0056866 A1 | 3/2005 | Bertin et al. |
| 2005/0056877 A1 | 3/2005 | Rueckes et al. |
| 2005/0058590 A1 | 3/2005 | Sen et al. |
| 2005/0058797 A1 | 3/2005 | Sen et al. |
| 2005/0058834 A1 | 3/2005 | Rueckes et al. |
| 2005/0059176 A1 | 3/2005 | Rueckes et al. |
| 2005/0059210 A1 | 3/2005 | Rueckes et al. |
| 2005/0062035 A1 | 3/2005 | Bertin et al. |
| 2005/0062062 A1 | 3/2005 | Bertin et al. |
| 2005/0062070 A1 | 3/2005 | Bertin et al. |
| 2005/0063210 A1 | 3/2005 | Segal et al. |
| 2005/0063244 A1 | 3/2005 | Bertin et al. |
| 2005/0065741 A1 | 3/2005 | Segal et al. |
| 2005/0068128 A1 * | 3/2005 | Yip ........................ 333/262 |
| 2005/0074926 A1 | 4/2005 | Bertin et al. |
| 2005/0101112 A1 | 5/2005 | Rueckes et al. |
| 2005/0128788 A1 | 6/2005 | Segal et al. |
| 2005/0139902 A1 | 6/2005 | Jung |
| 2005/0141266 A1 | 6/2005 | Jung |
| 2005/0141272 A1 | 6/2005 | Jung |
| 2005/0162896 A1 | 7/2005 | Jung |
| 2005/0174842 A1 | 8/2005 | Bertin et al. |
| 2005/0191495 A1 | 9/2005 | Rueckes et al. |
| 2005/0237781 A1 | 10/2005 | Bertin et al. |
| 2005/0269553 A1 | 12/2005 | Sen et al. |
| 2005/0269554 A1 | 12/2005 | Sen et al. |
| 2005/0270824 A1 | 12/2005 | Bertin et al. |
| 2005/0279988 A1 | 12/2005 | Bertin |
| 2005/0280436 A1 | 12/2005 | Bertin |
| 2005/0281084 A1 | 12/2005 | Rueckes et al. |
| 2005/0282515 A1 | 12/2005 | Bertin |
| 2005/0282516 A1 | 12/2005 | Bertin |
| 2006/0044035 A1 | 3/2006 | Bertin |
| 2006/0061389 A1 | 3/2006 | Bertin |
| 2006/0125033 A1 | 6/2006 | Segal et al. |
| 2006/0128049 A1 | 6/2006 | Jaiprakash et al. |
| 2006/0183278 A1 | 8/2006 | Bertin et al. |
| 2006/0193093 A1 | 8/2006 | Bertin et al. |
| 2006/0204427 A1 | 9/2006 | Ghenciu et al. |
| 2006/0231865 A1 | 10/2006 | Rueckes et al. |
| 2006/0237805 A1 | 10/2006 | Segal et al. |
| 2006/0237857 A1 | 10/2006 | Bertin et al. |
| 2006/0250843 A1 | 11/2006 | Bertin et al. |
| 2006/0250856 A1 | 11/2006 | Bertin et al. |
| 2006/0255834 A1 | 11/2006 | Bertin |
| 2006/0276056 A1 | 12/2006 | Ward et al. |
| 2007/0015303 A1 | 1/2007 | Bertin et al. |

FOREIGN PATENT DOCUMENTS

| JP | 2004-090208 | | 3/2004 |
|---|---|---|---|
| WO | WO 00/48195 | | 8/2000 |
| WO | WO 01/03208 | A1 | 1/2001 |
| WO | WO 01/03208 | A1 | 1/2001 |
| WO | WO 01/44796 | A1 | 6/2001 |
| WO | WO 03/091486 | A1 | 11/2003 |
| WO | WO2004/065655 | A1 | 8/2004 |
| WO | WO2004/065657 | A1 | 8/2004 |
| WO | WO2004/065671 | A1 | 8/2004 |

OTHER PUBLICATIONS

Ami, S. et al., "Logic gates and memory cells based on single $C_{60}$ electromechanical transistors," Nanotechnology, 2001, vol. 12, pp. 44-52.

Avouris, Ph., "Carbon nanotube electronics," Carbon, 2002, vol. 14, pp. 1891-1896.

Berhan, L. et al., "Mechanical properties of Nanotube sheets: alterations in joint morphology and achievable moduli in manufacturable materials," Journal of Appl. Phys., 2004, vol. 95(8), pp. 4335-4344.

Cao, J. et al., "Electromechanical properties of metallic, quasimetallic, and semiconducting carbon nanotubes under stretching," Phys. Rev. Lett., 2003, vol. 90 (15), pp. 157601-1 = 157601-4.

Casavant, M.J. et al., "Neat macroscopic membranes of aligned carbon nanotubes," Journal of Appl. Phys., 2003, vol. 93(4), pp. 2153-2156.

Cui, J.B. et al., "Carbon Nanotube Memory Devices of High Charge Storage Stability," Appl. Phys. Lett., 2002, vol. 81(17), pp. 3260-3262.

Dehon, A., "Array-Based Architecture for FET-Based, Nanoscale Electronics," IEEE Transactions on Nanotechnology, 2003, vol. .2(1), pp. 23-32.

Dequesnes, M. et al., "Calculation of pull-in voltages for carbon-nanotube-based nanoelectromechanical switches," Nanotechnology, 2002, vol. 13, pp. 120-131.

Dequesnes, M. et al., "Simulation of carbon nanotube-based nanoelectromechanical switches," Computational Nanoscience and Nanotechnology, 2002, pp. 383-386.

Fan, S. et al., "Carbon nanotube arrays on silicon substrates and their possible application," Physica E, 2000, vol. 8, pp. 179-183.

Farajian, A. A. et al., "Electronic transport through bent carbon nanotubes: Nanoelectromechanical sensors and switches," Phys. Rev. B, 2003, vol. 67, pp. 205423-1 = 205423-6.

Fischer, J.E. et al., "Magnetically aligned single wall carbon nanotube films: Preferred orientation and anisotropic transport properties," Journal of Appl. Phys., 2003, Vol. 93(4), pp. 2157-2163.

Franklin, N. R. et al., "Integration of suspended carbon nanotube arrays into electronic devices and electromechanical systems," Appl. Phys. Lett., 2002, vol. 81(5), pp. 913-915.

Fuhrer, M.S. et al., "High-Mobility Nanotube Transistor Memory," Nano Letters, 2002, vol. 2(7), pp. 755-759.

Homma, Y. et al., "Growth of Suspended Carbon Nanotube Networks on 100-nm-scale Silicon Pillars," Applied Physics Letters, 2002, vol. 81(12), pp. 2261-2263.

Kinaret, J.M. et al., "A carbon-nanotube-based nanorelay," Appl. Phys. Lett., 2003, vol. 82(8), pp. 1287-1289.

Nardelli, M. Buongiorno et al., "Mechanical properties, defects and electronic behavior of carbon nanotubes," Carbon, 2000, vol. 38, pp. 1703-1711.

Poncharal, P., et al., "Electrostatic Deflections and Electromechanical Resonances of Carbon Nanotubes," Science, 1999, vol. 283, pp. 1513-1516.

Radosavlievic, M. et al., "Nonvolatile molecular memory elements based on ambipolar nanotube field effect transistors," Nano Letters, 2002, vol. 2(7), pp. 761-764.

Robinson, L.A.W., "Self-Aligned Electrodes for Suspended Carbon Nanotube Structures," Microelectronic Engineering, 2003, vols. 67-68, pp. 615-622.

Rueckes, T., et al., "Carbon Nanotube—Based Nonvolatile Random Access Memory for Molecular Computing" Science, 2000, vol. 289, pp. 94-97.

Ruoff, R.S. et al., "Mechanical and thermal properties of carbon nanotubes," Carbon, 1995. vol. 33(7), pp. 925-930.

Sapmaz, S. et al., "Carbon nanotubes as nanoelectromechanical systems," Phys. Rev. B., 2003, vol. 67, pp. 235414-1 = 235414-6.

Soh, H. T. et al., "Integrated nanotube circuits: Controlled growth and Ohmic contacting of single-walled carbon nanotubes," Appl. Phys. Lett., 1999, vol. 75(5), pp. 627-629.

Sreekumar, T.V., et al., "Single-wall Carbon Nanotube Films", Chem. Mater. 2003, vol. 15, pp. 175-178.

Tans, S. et al., "Room-temperature based on a single carbon nanotube," Nature, 1998. vol. 393, pp. 49-52.

Tour, J. M. et al., "NanoCell Electronic Memories," J. Am. Chem Soc., 2003, vol. 125, pp. 13279-13283.

Verrissimo-Alves, M. et al., "Electromechanical effects in carbon nanotubes: Ab initio and analytical tight-binding calculations," Phys. Rev. B, 2003, vol. 67, pp. 161401-1 = 161401-4.

Bernholc et al., "Mechanical and electrical properties of nanotubes", Ann. Rev. Mater. Res., vol. 32, p. 347, 2002.

Bradley, K. et al., "Flexible Nanotube Electronics", Nano Letters, vol. 3, No. 10, pp. 1353-1355. 2003.

Collins, et al., Engineering Carbon Nanotubes and Nanotube Circuits Using Electrical Breakdown, Science, vol. 292, pp. 706-709, Apr. 2001.

Kinaret, J. M. et al,, "A Carbon-nanotube-based nanorelay," Applied Physics Letters, Feb. 24, 2003, vol. 82, No. 8, pp. 1287-1289.

Martel, R., et al, "Carbon Nanotube Field-Effect Transistors and Logic Circuits," DAC 2002, Jun. 10-12, 2002, vol. 7.4, pp. 94-98.

Onoa et al., "Bulk Production of singly dispersed carbon nanotubes with prescribed lengths", Nanotechnology, vol. 16, pp. 2799-2803, 2005.

Stadermann, M. et al., "Nanoscale study of conduction through carbon nanotube networks", Phys. Rev. B 69, 201402(R), 2004.

Batchtold, A., et al., "Logic circuits cased on carbon nanotubes," *Physica E*, 2003, vol. 16, pp. 42-46.

Chen, J. et al., "Self-aligned carbon nanotube transistors with charge transfer doping", *Applied Physics Letters*, vol. 86, pp. 123108-1-123108-3, 2005.

Chen, J. et al., "Self-aligned Carbon Nanotube Transistors with Novel Chemical Doping", *IEDM*, pp. 29.4.1-29.4.4, 2004.

Derycke, V. et al., "Controlling doping and carrier injection in carbon nanotube transistors", *Applied Physics Letters*, vol. 80, No. 15, pp. 2773-2775, Apr. 15, 2002.

Derycke, V., et al., "Carbon Nanotube Inter- and Intramolecular Logic Gates," Nano Letters, Sep. 2001, vol. 1, No. 9, pp. 453-456.

Duan, X. et al., "Nonvolatile Memory and Programmable Logic from Molecule-Gated Nanowires", *Nano Letters*, vol. 0, No. 0, pp. A-D, 2002.

Heinze, S. et al., "Carbon Nanotubes as Schottky Barrier Transistsors", *Physical Review.*

*Letters*, vol. 89, No. 10, pp. 16801-106801-4, 2002.

Huang, Y., et al "Logic Gates and Computation from Assembled Nanowire Building Blocks," *Science*, Nov. 9, 2001, vol. 294, pp. 1313-1316.

Javey, A. et at, "Carbon Nanotube Field-Effect Transistors with Integrated Ohmic Contacts and High-k Gate Dielectrics", *Nano Letters*, vol. 4, No. 3, pp. 447-450, 2004.

Javey, A. et al., "High-k dielectrics for advanced carbon-nanotube transistors and logic gates", Nature Materials, vol. 1, pp. 241-246, Dec. 2002.

Javey, A., et al., "Carbon Nanotube Transistor Arrays for Multistage Complementary Logic and Ring Oscillators," *Nano Letters*, 2002, vol. 2, No. 9, pp. 929-932.

Lin, Y.M. et al., "Novel Carbon Nanotube FET Design with Tunable Polarity", *IEDM*, pp. 29.2.1-29.2.4, 2004.

Luyken, R. J. et al., "Concepts for hybrid CMOS-molecular nonvolatile memories", *Nanotechnology* vol. 14, pp. 273-276, 2003.

Wind, S. J. et al., "Vertical scaling of carbon nanotube field-effect transistors using top gate electrodes", *Applied Physics Letters*, vol. 80, No. 20, pp. 3817-3819, May 20, 2002.

Batchtold, A., et al., "Logic circuits cased on carbon nanotubes," *Physica E*, 2003, vol. 16, pp. 42-46.

Chen, J. et al., "Self-aligned carbon nanotube transistors with charge transfer doping", *Applied Physics Letters*, vol. 86, pp. 123108-1 - 123108-3, 2005.

Chen, J. et al., "Self-aligned Carbon Nanotube Transistors with Novel Chemical Doping", *IEDM*, pp. 29.4.1-29.4.4, 2004.

Derycke, V. et al., "Controlling doping and carrier injection in carbon nanotube transistors",*Applied Physics Letters*, vol. 80, No. 15, pp. 2773-2775, Apr. 15, 2002.

Derycke, V., et al., "Carbon Nanotube Inter- and Intramolecular Logic Gates," *Nano Letters*, Sep. 2001, vol. 1, No. 9, pp. 453-456.

Duan, X. et al., "Nonvolatile Memory and Programmable Logic from Molecule-Gated Nanowires", *Nano Letters*, vol. 0, No. 0, pp. A-D, 2002.

Heinze, S. et al., "Carbon Nanotubes as Schottky Barrier Transistsors", *Physical Review Letters*, vol. 89, No. 10, pp. 16801-1 - 106801-4, 2002..

Huang, Y., et al "Logic Gates and Computation from Assembled Nanowire Building Blocks," *Science*, Nov. 9, 2001, vol. 294, pp. 1313-1316.

Javey, A. et al., "Carbon Nanotube Field-Effect Transistors with Integrated Ohmic Contacts and High-k Gate Dielectrics", *Nano Letters*, vol. 4, No. 3, pp. 447-450, 2004.

Javey, A. et al., "High-k dielectrics for advanced carbon-nanotube transistors and logic gates", *Nature Materials*, vol. 1, pp. 241-246, Dec. 2002.

Javey, A., et al., "Carbon Nanotube Transistor Arrays for Multistage Complementary Logic and Ring Oscillators," *Nano Letters*, 2002, vol. 2 , No. 9, pp. 929-932.

Lin, Y.M. et al., "Novel Carbon Nanotube FET Design with Tunable Polarity", *IEDM*, pp. 29.2.1 - 29.2.4, 2004.

Luyken, R. J. et al., "Concepts for hybrid CMOS-molecular non-volatile memories", *Nanotechnology*, vol. 14, pp. 273-276, 2003.

Wind, S. J. et al., "Fabrication and Electrical Characterization of Top Gate Single-Wall Carbon Nanotube Field-Effect Transistors", J. Vac. Sci. Technol. B vol. 20, Issue 6, Nov. 2002, 14 pages.

Wind, S. J. et al., "Vertical scaling of carbon nanotube field-effect transistors using top gate electrodes", *Applied Physics Letters*, vol. 80, No. 20, pp. 3817-3819, May 20, 2002.

\* cited by examiner

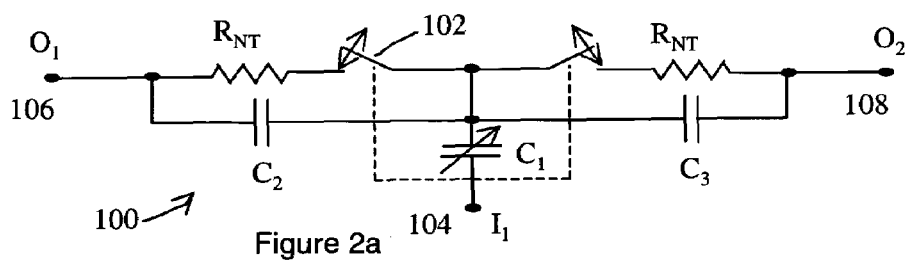
Figure 2a
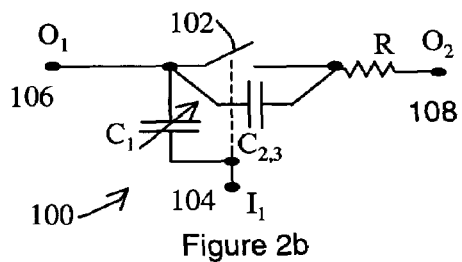
Figure 2b
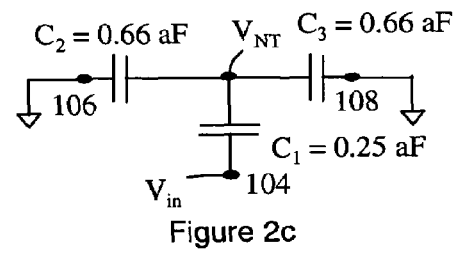
Figure 2c
Assumptions:
- # NTs = 10
- Fabric: 94% void
- Volatile operation
- 90 nm tech. node
|   | NT-Open | NT-Closed |
|---|---|---|
| R | > 500 MΩ | ≈ 6 KΩ |
| $C_2 = C_3$ | ≈ 0.66 aF | |
| $C_{2,3}$ | ≈ 0.33 aF | |
| $C_1$ | ≈ 0.25 aF | ≈ 4.3 aF |
Figure 2d

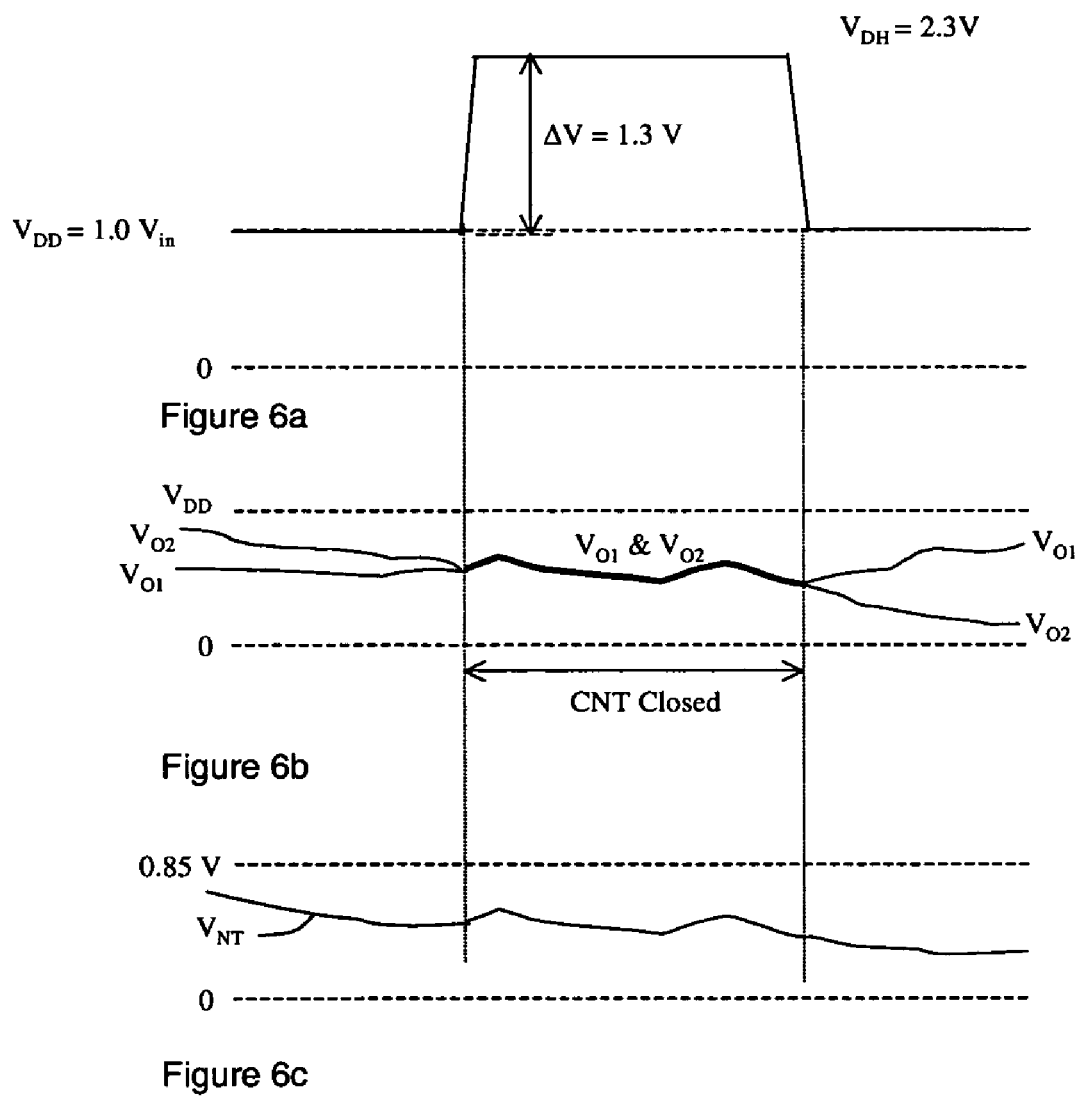

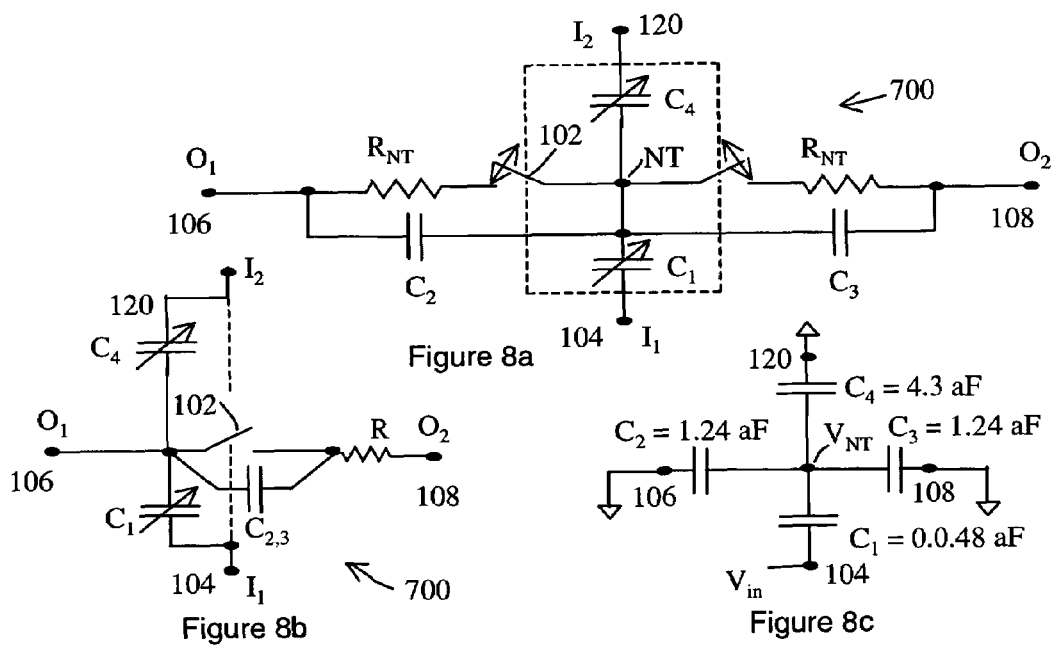

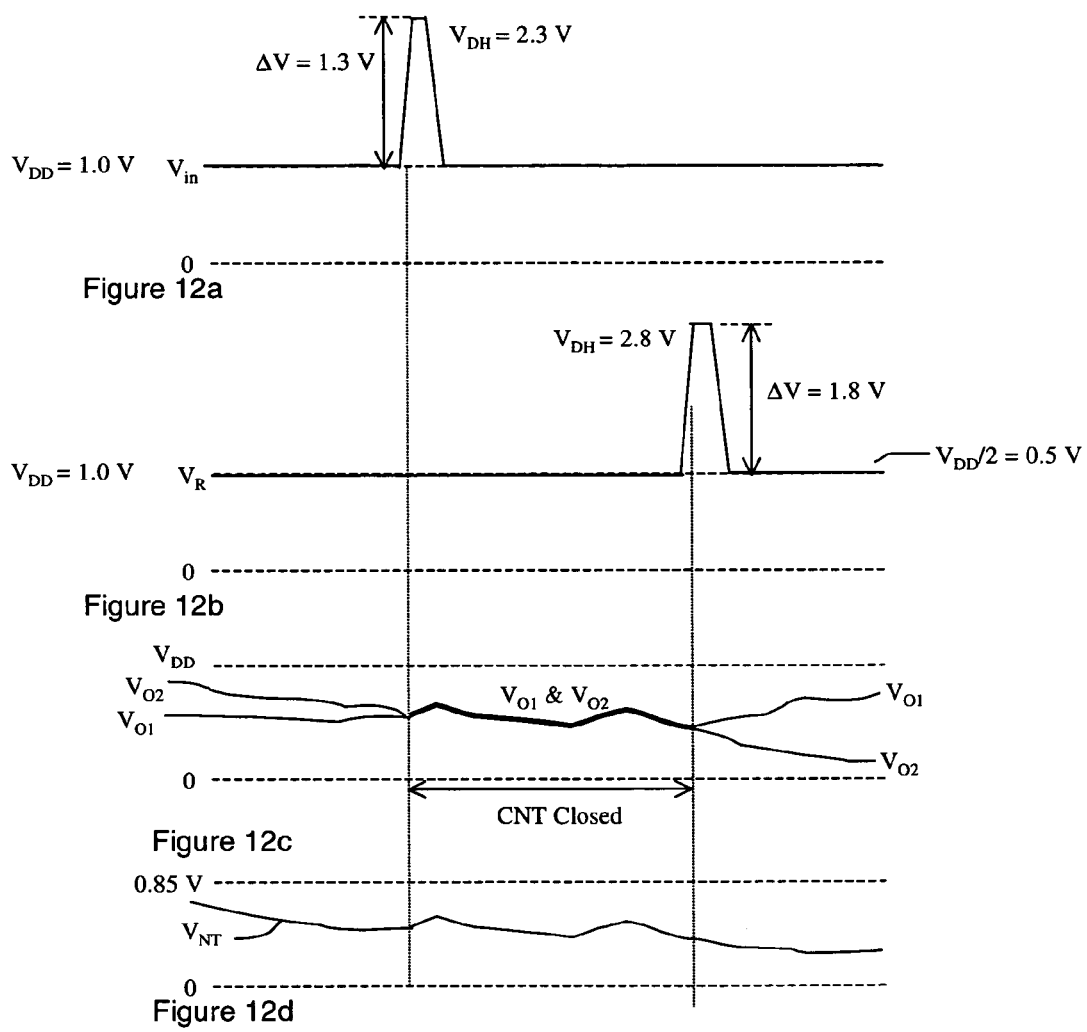

NANOTUBE-BASED TRANSFER DEVICES AND RELATED CIRCUITS

CROSS-REFERENCE TO RELATED APPLICATIONS

This application claims the benefit of U.S. Provisional Patent Application Ser. No. 60/580,799 filed Jun. 18, 2004, entitled Carbon Nanotube Microswitch Transfer Devices, the entire contents of which are incorporated herein by reference.

This application is related to the following applications:

U.S. patent application Ser. No. 10/917,794, filed on Aug. 13, 2004, entitled Nanotube-Based Switching Elements;

U.S. patent application Ser. No. 10/918,085, filed on Aug. 13, 2004, entitled Nanotube-Based Switching Elements With Multiple Controls;

U.S. patent application Ser. No. 10/918,181, filed on Aug. 13, 2004, entitled Nanotube Device Structure And Methods Of Fabrication;

U.S. patent application Ser. No. 10/917,893, filed on Aug. 13, 2004, entitled Nanotube-Based Switching Elements And Logic Circuits;

U.S. patent application Ser. No. 10/917,606, filed on Aug. 13, 2004, entitled Isolation Structure For Deflectable Nanotube Elements;

U.S. patent application Ser. No. 10/917,932, filed on Aug. 13, 2004, entitled Circuits Made From Nanotube-Based Switching Elements With Multiple Controls;

U.S. patent application Ser. No. 11/033,089, filed on date even herewith, entitled Integrated Nanotube And Field Effect Switching Device;

U.S. patent application Ser. No. 11/033,213, filed on date even herewith, entitled Receiver Circuit Using Nanotube-Based Switches And Transistors;

U.S. patent application Ser. No. 11/033,215, filed on date even herewith, entitled Receiver Circuit Using Nanotube-Based Switches And Logic;

U.S. patent application Ser. No. 11/033,216, filed on date even herewith, entitled Nanotube-Based Logic Driver Circuits;

U.S. patent application Ser. No. 11/032,983, filed on date even herewith, entitled Storage Elements Using Nanotube Switching Elements; and U.S. patent application Ser. No. 11/032,823, filed on date even herewith, entitled Tristate Circuit Using Nanotube Switching Elements.

TECHNICAL FIELD

This invention relates to nanotube technology and to switching devices that may be used in integrated circuits, including logic circuits, memory devices, etc.

BACKGROUND

Digital logic circuits are used in personal computers, portable electronic devices such as personal organizers and calculators, electronic entertainment devices, and in control circuits for appliances, telephone switching systems, automobiles, aircraft and other items of manufacture. Early digital logic was constructed out of discrete switching elements composed of individual bipolar transistors. With the invention of the bipolar integrated circuit, large numbers of individual switching elements could be combined on a single silicon substrate to create complete digital logic circuits such as inverters, NAND gates, NOR gates, flip-flops, adders, etc. However, the density of bipolar digital integrated circuits is limited by their high power consumption and the ability of packaging technology to dissipate the heat produced while the circuits are operating. The availability of metal oxide semiconductor ("MOS") integrated circuits using field effect transistor ("FET") switching elements significantly reduces the power consumption of digital logic and enables the construction of the high density, complex digital circuits used in current technology. The density and operating speed of MOS digital circuits are still limited by the need to dissipate the heat produced when the device is operating.

Digital logic integrated circuits constructed from bipolar or MOS devices do not function correctly under conditions of high heat or extreme environments. Current digital integrated circuits are normally designed to operate at temperatures less than 100 degrees centigrade and few operate at temperatures over 200 degrees centigrade. In conventional integrated circuits, the leakage current of the individual switching elements in the "off" state increases rapidly with temperature. As leakage current increases, the operating temperature of the device rises, the power consumed by the circuit increases, and the difficulty of discriminating the off state from the on state reduces circuit reliability. Conventional digital logic circuits also short internally when subjected to certain extreme environments because electrical currents are generated inside the semiconductor material. It is possible to manufacture integrated circuits with special devices and isolation techniques so that they remain operational when exposed to such environments, but the high cost of these devices limits their availability and practicality. In addition, such digital circuits exhibit timing differences from their normal counterparts, requiring additional design verification to add protection to an existing design.

Integrated circuits constructed from either bipolar or FET switching elements are volatile. They only maintain their internal logical state while power is applied to the device. When power is removed, the internal state is lost unless some type of non-volatile memory circuit, such as EEPROM (electrically erasable programmable read-only memory), is added internal or external to the device to maintain the logical state. Even if non-volatile memory is utilized to maintain the logical state, additional circuitry is necessary to transfer the digital logic state to the memory before power is lost, and to restore the state of the individual logic circuits when power is restored to the device. Alternative solutions to avoid losing information in volatile digital circuits, such as battery backup, also add cost and complexity to digital designs.

Important characteristics for logic circuits in an electronic device are low cost, high density, low power, and high speed. Conventional logic solutions are limited to silicon substrates, but logic circuits built on other substrates would allow logic devices to be integrated directly into many manufactured products in a single step, further reducing cost.

Important characteristics for a memory cell in an electronic device are low cost, nonvolatility, high density, low power, and high speed. Conventional memory solutions include Read Only Memory (ROM), Programmable Read only Memory (PROM), Electrically Programmable Memory (EPROM), Electrically Erasable Programmable Read Only Memory (EEPROM), Dynamic Random Access Memory (DRAM) and Static Random Access Memory (SRAM).

ROM is relatively low cost but cannot be rewritten. PROM can be electrically programmed but with only a single write cycle. EPROM has read cycles that are fast relative to ROM and PROM read cycles, but has relatively long erase times and reliability only over a few iterative read/write cycles. EEPROM (or "Flash") is inexpensive, and has low power consumption but has long write cycles (ms) and low relative speed in comparison to DRAM or SRAM. Flash also has a finite number of read/write cycles leading to low long-term reliability. ROM, PROM, EPROM and EEPROM are all non-volatile, meaning that if power to the memory is interrupted, the memory will retain the information stored in the memory cells.

DRAM stores charge on transistor gates that act as capacitors but must be electrically refreshed every few milliseconds, complicating system design by requiring separate circuitry to "refresh" the memory contents before the capacitors discharge. SRAM does not need to be refreshed and is fast relative to DRAM, but has lower density and is more expensive relative to DRAM. Both SRAM and DRAM are volatile, meaning that if power to the memory is interrupted, the memory will lose the information stored in the memory cells.

Consequently, existing technologies are either non-volatile but are not randomly accessible and have low density, high cost, and limited ability to allow multiples writes with high reliability of the circuit's function, or they are volatile and complicate system design or have low density. Some emerging technologies have attempted to address these shortcomings.

For example, magnetic RAM (MRAM) or ferromagnetic RAM (FRAM) utilizes the orientation of magnetization or a ferromagnetic region to generate a nonvolatile memory cell. MRAM utilizes a magnetoresisitive memory element involving the anisotropic magnetoresistance or giant magnetoresistance of ferromagnetic materials yielding nonvolatility. Both of these types of memory cells have relatively high resistance and low-density. A different memory cell based upon magnetic tunnel junctions has also been examined but has not led to large-scale commercialized MRAM devices. FRAM uses a circuit architecture similar to DRAM but which uses a thin film ferroelectric capacitor. This capacitor is purported to retain its electrical polarization after an externally applied electric field is removed yielding a nonvolatile memory. FRAM suffers from a large memory cell size, and it is difficult to manufacture as a large-scale integrated component.

Another technology having non-volatile memory is phase change memory. This technology stores information via a structural phase change in thin-film alloys incorporating elements such as selenium or tellurium. These alloys are purported to remain stable in both crystalline and amorphous states allowing the formation of a bi-stable switch. While the nonvolatility condition is met, this technology appears to suffer from slow operations, difficulty of manufacture and reliability and has not reached a state of commercialization.

Wire crossbar memory (MWCM) has also been proposed. These memory proposals envision molecules as bi-stable switches. Two wires (either a metal or semiconducting type) have a layer of molecules or molecule compounds sandwiched in between. Chemical assembly and electrochemical oxidation or reduction are used to generate an "on" or "off" state. This form of memory requires highly specialized wire junctions and may not retain non-volatility owing to the inherent instability found in redox processes.

Recently, memory devices have been proposed which use nanoscopic wires, such as single-walled carbon nanotubes, to form crossbar junctions to serve as memory cells. See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94-97, 7 Jul. 2000. Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

U.S. Patent Publication No. 2003-0021966 discloses, among other things, electromechanical circuits, such as memory cells, in which circuits include a structure having electrically conductive traces and supports extending from a surface of a substrate. Nanotube ribbons that can electromechanically deform, or switch are suspended by the supports that cross the electrically conductive traces. Each ribbon comprises one or more nanotubes. The ribbons are typically formed from selectively removing material from a layer or matted fabric of nanotubes.

For example, as disclosed in U.S. Patent Publication No. 2003 0021966, a nanofabric may be patterned into ribbons, and the ribbons can be used as a component to create non-volatile electromechanical memory cells. The ribbon is electromechanically-deflectable in response to electrical stimulus of control traces and/or the ribbon. The deflected, physical state of the ribbon may be made to represent a corresponding information state. The deflected, physical state has non-volatile properties, meaning the ribbon retains its physical (and therefore informational) state even if power to the memory cell is removed. As explained in U.S. Patent Publication No. 2003-0124325, three-trace architectures may be used for electromechanical memory cells, in which the two of the traces are electrodes to control the deflection of the ribbon.

The use of an electromechanical bi-stable device for digital information storage has also been suggested.

The creation and operation of bi-stable, nano-electro-mechanical switches based on carbon nanotubes (including mono-layers constructed thereof) and metal electrodes has been detailed in previous patent applications of Nantero, Inc. (U.S. Pat. Nos. 6,574,130, 6,643,165, 6,706,402; U.S. patent application Ser. Nos. 09/915,093, 10/033,323, 10/033,032, 10/128,117, 10/341,005, 10/341,055, 10/341,054, 10/341, 130, 10/776,059, 10/776,572, 10/917,794, and 10/918,085, the contents of which are hereby incorporated by reference in their entireties).

SUMMARY OF THE INVENTION

In one aspect, the invention provides nanotube transfer devices that controllably form a nanotube-based electrically conductive channel between a first node and a second node under the control of a control structure. Each output node may be connected to an arbitrary network of electrical components. In certain embodiments, the electrical potential of the control structure induces a nanotube channel element to deflect into contact with or away from an electrode at each node. In certain embodiments, electrical circuits are provided that ensure proper switching of nanotube transfer devices interconnected with arbitrary circuits. The nanotube transfer device may be volatile or non-volatile. In preferred embodiments, the nanotube transfer device is a three-terminal device or a four-terminal device. The nanotube transfer device of various embodiments can be interconnected with other nanotube transfer devices, nanotube switching devices, nanotube-based logic circuits, MOS transistors, and other electrical components to form electrical circuits implementing analog functions, digital logic circuits, memory devices, etc. The nanotube transfer device of preferred embodiments has low capacitances, no forward voltage drop, high speed and low power operation. It is also radiation and heat tolerant. In another aspect, the invention also provides electrical circuits incorporating nanotube transfer devices having this or other architectures. Signal shaping circuits shift one or more control signals provided to a nanotube transfer device to an operating range where the state of channel formation can be predictably controlled, regardless of the potential of the nanotube channel element. This circuit enables a nanotube-based transfer device to be coupled to variable signals, with arbitrary values in the operating range of the circuit provided by the supply voltage, while retaining defined and predictable switching characteristics.

In one aspect of the invention, a nanotube transfer device is a three-terminal element. In one aspect of the invention, a nanotube transfer device includes a first output node, a second output node, a nanotube channel element including at least one electrically conductive nanotube and a control structure disposed in relation to the nanotube channel element to controllably form and unform an electrically conductive channel between the first output node and the second output node, the channel including the nanotube channel element. The nanotube channel element is constructed and arranged so that the nanotube channel element is not in electrical contact with either the first output node or the second output node in a state of the device. The control structure includes an electrode having an upper operating voltage that exceeds an upper operating voltage of the first operating range by at least an amount sufficient to ensure channel formation.

In another aspect of the invention, the nanotube channel element is constructed and arranged so that no electrical signal is provided to the nanotube channel element in a state of the device.

In another aspect of the invention, the nanotube channel element has a floating potential in a state of the device.

In another aspect of the invention, the control structure induces electromechanical deflection of the nanotube channel element to form the conductive channel. In another aspect of the invention, the electromechanical deflection forms the channel by causing the nanotube channel element to electrically contact an output electrode in the first output node and an output electrode in the second output node.

In another aspect of the invention, the first and second output nodes each include an isolation structure disposed in relation to the nanotube channel element so that channel formation is substantially independent of the state of the output nodes. In some embodiments, the isolation structure is provided by electrodes disposed on the opposite side of the nanotube channel element from output node contact electrodes in such a way as to produce substantially equal but opposite electrostatic forces. In some embodiments, the opposing electrodes are in low resistance electrical communication with the corresponding contact electrodes. In some embodiments, each output node includes a pair of output electrodes in electrical communication and the output electrodes of each pair are disposed on opposite sides of the nanotube channel element.

In another aspect of the invention, the nanotube channel element is suspended between insulative supports in spaced relation relative to a control electrode of the control structure. The device is constructed so that deflection of the nanotube channel element is in response to electrostatic attractive forces resulting from signals on the control electrode, independent of signals on the first output node or the second output node. In another aspect of the invention, the control electrode is electrically isolated from the nanotube channel element by an insulator.

In another aspect of the invention, the nanotube channel element is constructed from nanofabric. In another aspect of the invention, the nanofabric is preferably carbon nanofabric.

In another aspect of the invention, the device is non-volatile. In certain embodiments, the nanotube channel element is non-volatile such that it retains a positional state when a deflecting control signal provided via the control structure is removed. In another aspect of the invention, the device is volatile. In some embodiments, the nanotube channel element is volatile such that it returns to a normal positional state when a deflecting control signal provided via the control structure is removed.

In another aspect of the invention, a nanotube transfer device is a four-terminal device. The control structure includes a control electrode and a second control electrode disposed in relation to the nanotube channel element to control formation of the electrically conductive channel between the first output node and the second output node. The control electrode and the second control electrode are positioned on opposite sides of the nanotube channel element. One control electrode can be used to deflect the nanotube channel element to induce channel formation and one control electrode can be used to deflect the nanotube channel element in the opposite direction to prevent channel formation.

In another aspect of the invention, a nanotube transfer device circuit includes circuitry to ensure reliable switching of the nanotube channel element in a typical circuit application. In some embodiments, a signal shaping circuit is electrically coupled to the control structure. The signal shaping circuit receives an input signal from other circuitry and provides a control signal representative of the input signal to the control structure. A value of the control signal induces channel formation independent of the potential of the nanotube switching element. This aspect of the invention can be applied to nanotube-based transfer devices with various architectures. In some embodiments, the signal shaping circuit overdrives the control signal to a voltage above the supply voltage to predictably induce formation of the channel. In some embodiments, a second value of the control signal ensures the absence of channel formation independent of the potential of the nanotube switching element. In some embodiments, the signal shaping circuit shifts the input signal from a first range to a second range to provide the control signal, such that the state of channel formation is predictable at the endpoints of the second range.

In another aspect of the invention, for four-terminal devices, wherein the control structure includes a first control electrode and a second control electrode disposed on opposite sides of the nanotube channel element, a control signal is provided to each electrode. A second signal shaping circuit is electrically coupled to the control structure, and the second signal shaping circuit receives a second input signal and provides a second control signal representative of the second input signal to the second control electrode. A value of the second input signal induces unforming of the channel regardless of the potential of the nanotube switching element.

One advantage of certain embodiments is to provide an alternative to FET transfer devices that are becoming very difficult to scale. FET transfer devices have increasing problems with leakage currents because threshold voltages do not scale well. The transfer device of various embodiments of the present invention has low capacitances, no forward voltage drop, high speed and low power operation. These devices can also be used with complementary carbon nanotube (CCNT) logic devices as part of a nanotube CCNT logic family.

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

BRIEF DESCRIPTION OF THE DRAWINGS

FIG. 2a is a schematic representation of the nanotube transfer device of FIG. 1a;

FIG. 2b is a schematic representation of the nanotube transfer device of FIG. 1a;

FIG. 2c is a schematic used to calculate the amount of input voltage coupled to the nanotube channel element;

FIG. 2d is a table showing representative values for the electrical parameters in FIG. 2b;

FIGS. 6a-c are graphs of operating voltages in the nanotube transfer device circuit of FIG. 5;

FIG. 8a is a schematic representation of the nanotube transfer device of FIG. 7a;

FIG. 8b is a schematic representation of the nanotube transfer device of FIG. 7a;

FIG. 8c is a schematic used to calculate the amount of input voltage coupled to the nanotube channel element;

FIG. 8d is a table showing representative values for the electrical parameters in FIG. 8b;

FIGS. 12a-d are graphs of operating voltages in the nanotube transfer device of FIG. 11.

DETAILED DESCRIPTION

The invention provides nanotube transfer devices that controllably form a nanotube-based electrically conductive channel between a first node and a second node under the control of a control node, and also provides electrical circuits incorporating such nanotube transfer devices. The electrical potential at the control node induces a nanotube channel element to deflect into contact with or away from an electrode at each node. Each output node may be connected to an arbitrary network of electrical components. In certain embodiments, electrical circuits are designed to ensure proper switching of nanotube transfer devices interconnected with arbitrary circuits. The nanotube transfer device may be volatile or non-volatile. In preferred embodiments, the nanotube transfer device is a three-terminal device or a four-terminal device. The nanotube transfer device of various embodiments can be interconnected with other nanotube transfer devices, nanotube-based logic circuits, nanotube switching devices (for example, those disclosed in application Ser. No. 10/918,085 and application Ser. No. 10/917,794) MOS transistors, and other electrical components to form electrical circuits implementing analog functions, digital logic circuits, memory devices, etc. The nanotube transfer device of preferred embodiments has low capacitances, no forward voltage drop, high speed and low power operation. It is also radiation and heat tolerant. Electrical circuits shape the control signals such that the desired state of channel formation can be produced regardless of the potential of the nanotube channel element (within its operating range, typically defined by the power supply voltages). The electrical circuits can be applied to different nanotube-based switch architectures to provide devices that can be connected to arbitrary, variable signals, while maintaining the desired switching characteristics.

Figure 1A:
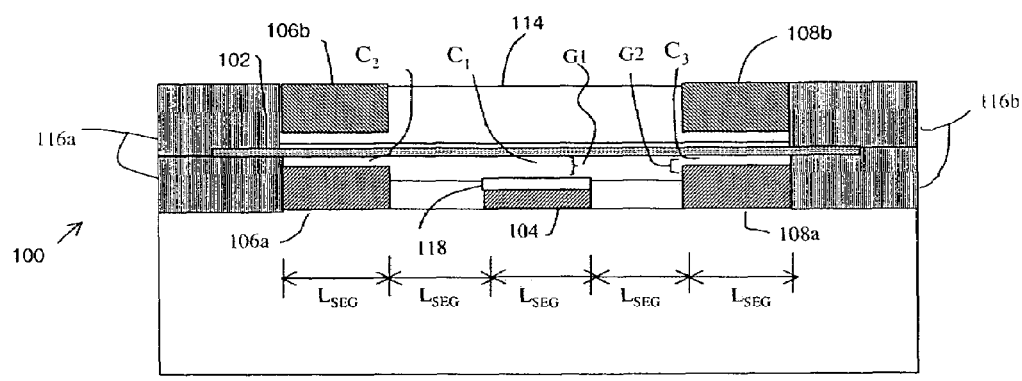
FIG. 1a is a side cross-sectional view of a nanotube transfer device according to an embodiment of the present invention.

FIG. 1a is a cross-sectional view of a nanotube transfer device constructed according to one embodiment of the invention. A nanotube channel element 102 is suspended and clamped by support structure 116 (including supports 116a and 116b). Transfer device 100 includes a control electrode 104, a first output node 106 (including output electrodes 106a and 106b) and a second output node 108 (including output electrodes 108a and 108b).

The transfer device 100 is disposed on a substrate 101 and includes a lower portion and an upper portion. The lower portion includes control electrode 104, first output electrode 106a and second output electrode 108a. Control electrode 104, first output electrode 106a and second output electrode 108a are made of conductive material. Input electrode 104 is also referred to herein as the control node or gate. First output electrode 106a and second output electrode 108a are also referred to herein as the source node and drain node, respectively, for convenience. The lower portion also includes an insulating layer 118 that insulates the electrodes from each other and also covers the upper face of control electrode 104 to isolate the nanotube channel element 102 from the control electrode 104. Nanotube channel element 102 is separated from the facing surface of insulator 118 by a gap height G1. G1 is defined by the respective thickness of input electrode 104, insulator 118 and support structures 116a and 116b. Nanotube channel element 102 is also separated from the facing surfaces of first output electrode 106a and second output electrode 108a by a gap height G2. In the illustrated embodiment, G1 is greater than G2.

The upper portion includes a first opposing output electrode 106b and a second opposing output electrode 108b. First opposing output electrode 106b and second opposing output electrode 108b are made of conductive material. An insulating layer 114 insulates the electrodes 106b and 108b from each other and from the nanotube channel element 102. The nanotube channel element 102 is suspended by support structure 116 between the upper portion and the lower portion of transfer device 100; the nanotube channel element 102 is in spaced relation to electrodes 104, 106a, 106b, 108a and 108b. The spaced relationship is defined by G1 and G2. As described further below, because electrodes 106b and 108b are preferably provided to cancel the effects of undefined signals on electrodes 106a and 108a, electrodes 106b and 108b are preferably also spaced apart from nanotube channel element 102 by gap G3, which may be equal to gap G2. Of the electrodes, only first output electrode 106a and second output electrode 108a are not insulated from the nanotube channel element.

The nanotube channel element 102 is subjected to various capacitive interactions with the electrodes of transfer device 100. The gap between nanotube channel element 102 and input electrode 104 defines a capacitance C1. The gap between nanotube channel element 102 and output electrode 106 defines a second capacitance C2. The gap between nanotube channel element 102 and output electrode 108 defines a third capacitance C3.

In certain embodiments, the nanotube channel element 102 is made of a porous fabric of nanotubes, e.g., single-walled carbon nanotubes. In preferred embodiments, each nanotube has homogenous chirality, being either a metallic or semiconductive species. The fabric however may contain a combination of nanotubes of different species, and the relative amounts may be tailorable, e.g., fabrics with higher concentrations of metallic species. The nanotube channel element 102 is lithographically defined to a predetermined shape as explained in the patent references incorporated herein by reference. The nanotube channel element of preferred embodiments is suspended by insulative supports 116a and 116b in spaced relation to the control electrode 104 and the output electrodes 106a, 106b, 108a, 108b. The nanotube channel element 102 can be held to the insulating support structure 116 by friction, or other techniques. With $L_{SEG}=90$ nm, the suspended length of the carbon nanotube channel is 450 nm. The support is assumed to be an insulator such as $SiO_2$. The support can be made from any appropriate material, however. Gap G1 is selected 100 nm, of which 80 nm is air (or vacuum) with $\epsilon_R=1$, and 20 nm is a dielectric layer such as $SiO_2$, with $\epsilon_R=4$. The channel element width $W_{NT}=450$ nm. An input signal on electrode 104 activates the channel element 102 by applying an electrostatic force $F_E \alpha V_E^2$, where $V_E$ is a nanotube activation voltage. Gap G2 is selected such that channel element 102 contacts output nodes 106 and 108 when the input signal is activated. By design, there is no net disturbing force between channel element 102 and the output terminals, regardless of applied voltages, due the presence of an opposing electrode at each output node. In certain embodiments, the thickness of the insulating layers 118 and 114 is in the range of 5-30 nm. In certain embodiments, the suspended length to gap ration is about 5-15 to 1 for nonvolatile devices, and less than 5 for volatile devices. While other dimensions are possible, these dimensions are provided as representative ranges of dimensions for typical devices.

Figure 1B:
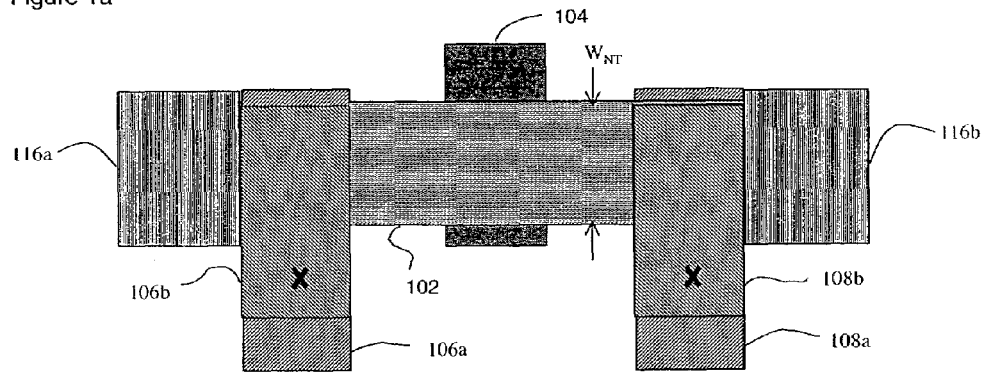
FIG. 1b is a top plan view or layout view of a nanotube transfer device according to an embodiment of the present invention.

FIG. 1b is a plan view or layout of nanotube transfer device 100. As shown in this figure, electrodes 106a, b are electrically connected as depicted by the notation 'X'. Electrodes 106a, b collectively form a single output node 106 of device 100. Likewise, electrodes 108a, b are electrically connected as depicted by the 'X'. Electrodes 108a, b collectively form a single output node 108 of device 100. Each output node 106, 108 can respectively be connected to an electrical network.

A potential difference between the input electrode 104 and the nanotube channel element 102 causes the nanotube channel element 102 to be attracted to the input electrode 104 and causes deformation of the nanotube channel element to contact the lower portion of transfer device 100. Placing an electrical potential on input electrode 104 induces deformation of the nanotube channel element 102 when the potential difference rises above a threshold voltage $V_T$. Input electrode 104 is insulated by a dielectric 118. When nanotube channel element 102 deforms under electrical stimulation through input terminal 104, it contacts output terminals 106 and 108.

Nanotube transfer device 100 operates as follows. Nanotube transfer device 100 is in an OFF state when nanotube channel element is in the position shown in FIG. 1a (or in any other position where the nanotube channel element 102 is not contacting both output electrode 106a and output electrode 108a). In this state, there is no connection to the nanotube channel element 102, which has a floating potential. Control electrode 104 and nanotube channel element 102, however, are capacitively coupled (capacitance C1). Nanotube channel element 102 is also capacitively coupled to output electrode 106 (capacitance C2) and to output electrode 108 (capacitance C3). In the OFF state, there is no electrical connection between output node 106 and output node 108 through transfer device 100. The respective networks connected to each output node 106, 108 are electrically isolated from each other. Nanotube transfer device 100 is in an ON state when nanotube channel element 102 is deflected towards the lower portion of transfer device 100 and contacts output electrode 106a and output electrode 108a at the same time. Nanotube channel element 102 is deflected by attractive electrostatic forces created by a potential difference between control electrode 104 and nanotube channel element 102. When the potential difference exceeds a threshold value $V_T$, the nanotube channel element 102 is attracted toward control electrode 104 and the fabric stretches and deflects until it contacts the lower portion of nanotube transfer device 100. Nanotube channel element 102 is not sensitive to the polarity of the signal on control electrode 104, only the difference in potential. Since control electrode 104 is isolated from nanotube channel element 102 by insulating layer 118, control electrode 104 does not mechanically or electrically contact nanotube channel element 102. Nanotube channel element mechanically and electrically contacts output electrode 106a and output electrode 108a when it deflects. Nanotube channel element 102 provides a conductive path between output electrodes 106a and 108a in the ON state. Accordingly, the respective networks connected to each are electrically interconnected in the ON state. A control signal provided on control electrode 104 can be used to controllably form and unform the channel between output electrode 106a and output electrode 108a by controlling the position of nanotube channel element 102.

By properly tailoring the geometry of nanotube transfer device 100, the nanotube transfer device 100 may be made to behave as a non-volatile or a volatile transfer device. When nanotube channel element 102 deflects due to electrostatic forces, when the control signal is removed, van der Waals forces between the nanotube channel element 102 and the control electrode 104 tend to hold the nanotube channel element 102 in place. The nanotube channel element 102 is under mechanical stress due to the deflection and a mechanical restoring force is also present. The restoring force tends to restore nanotube channel element 102 to the rest state shown in FIG. 1a. The device 100 will be volatile if the restoring force is greater than the van der Waals forces. Device 100 will be non-volatile if the restoring force is not sufficient to overcome the van der Waals forces. By way of example, the device may be made to be non-volatile by proper selection of the length of the channel element relative to the gap G1. Length to gap ratios of greater than 5 and less than 15 are preferred for non-volatile devices; length to gap rations of less than 5 are preferred for volatile devices.

Output nodes 106 and 108 are constructed to include an isolation structure in which the operation of the channel element 102, and thereby the state of the channel, is invariant to the state of either of output nodes 106 and 108. A floating output node 106 or 108 could have any potential between ground and the power supply voltage $V_{DD}$ in theory, determined by the network to which it is interconnected. Since the channel element 102 is electromechanically deflectable in response to electrostatically attractive forces, when the potential on an output node is sufficiently different relative to the potential of the nanotube channel element 102, a floating output node could cause the nanotube channel element 102 to deflect unpredictably and interfere with the operation of the transfer device 100. In the illustrated embodiment, this problem is addressed by providing an opposing output electrode that is insulated for each output electrode. Output electrodes 106b and 108b are electrically connected to and effectively cancel out the floating potentials on output electrodes 106a and 108a. As shown in FIG. 1a, nanotube channel element 102 is disposed between pairs of oppositely disposed electrodes 106a, b and 108a, b. The corresponding electrodes are interconnected as shown in FIG. 1b. Each electrode in an output node 106, 108 is at the same potential. The gap distance between nanotube channel element 102 and output electrodes 106a and 108a and opposing output electrodes 106b and 108b is the same in the preferred embodiment. Thus the respective electrodes of each output node exert opposing electrostatic forces on nanotube channel element 102 regardless of the actual voltage present on each node. The nanotube channel element 102 is thus isolated from the voltage present on each output node. The deflection of nanotube channel element 102 and formation/unformation of the conductive channel can be reliably determined by the signal provided on control electrode 104.

FIG. 2a is a schematic representation of nanotube transfer device 100. Nanotube transfer device 100 is modeled in terms of equivalent resistances and capacitances. In the open or OFF state, nanotube transfer device 100 includes a first variable capacitance C1 between nanotube switching element 102 and input electrode 104, second capacitance C2 between nanotube switching element 102 and first output electrode 106, and third capacitance C3 between nanotube switching element 102 and second output electrode 108. In the closed or ON state, nanotube transfer device 100 includes the C1 and also includes a first resistance R1 between the first output electrode 106 and the nanotube switching element 102 and a second resistance R2 between the second output electrode 108 and the nanotube switching element 102. FIG. 2b is a transfer device equivalent circuit (schematic) derived from the schematic representation of FIG. 2a. FIG. 2c is a schematic, derived from the schematic of FIG. 2a, used to calculate the amount of input voltage coupled to the nanotube layer. FIG. 2d provides exemplary values for the electrical variables in FIGS. 2a, b, c in one embodiment of the present invention.

In operation, connecting nanotube transfer device 100 to arbitrary circuits at the first output node 106 and the second output node 108 requires overdriving the device to insure correct operation regardless of the voltage on either output node. If the rail voltages are 0 V and $V_{DD}$, output nodes 106 and 108 may be at any voltage between (and including) the rail voltages. When nanotube channel element 102 is in the OFF state, its potential is not defined. The capacitance network coupled to the nanotube channel element 102 determines the voltage $V_{NT}$. It may be any value between 0 V and $V_{DD}$. If C2=C3=0.66 aF, Ceq=0.33 aF because C2 and C3 are in series between the output nodes 106 and 108. The impedance at output electrodes 106 and 108 is small compared to the impedance associated with C2 and C3. To ensure that the nanotube channel element 102 remains OFF in the OFF steady state, the voltage on input electrode 104 $V_{in}$ must be greater than about 0.4 V in the OFF state. To ensure that nanotube channel element 102 switches properly from OFF to ON, $V_{in}$, the voltage on input electrode 104 must be greater than the potential of the nanotube channel element 102 by at least the threshold voltage $V_T$. Thus, input electrode 104 must be overdriven to a value sufficient to guarantee that the nanotube channel element 102 deforms regardless of its floating potential. The transition voltage ΔV on the input terminal 104 is partially coupled to nanotube channel element 102 during switching. As ΔV increases, $V_{NT}$ also increases by a proportional amount. The network shown in FIG. 2c, is used to estimate the coupling voltage. The voltage $V_{in}$ applied to terminal 104 is distributed between input capacitance $C_1$ and capacitances $C_2$ and $C_3$ in parallel, as illustrated by the equivalent circuit in FIG. 2c, resulting in approximately 15% of the ΔV coupling to nanotube channel element 102. Thus, $V_{in}$ at input terminal 104 only increases by 0.85 ΔV, the relative voltage between input electrode 104 and nanotube channel element 102. To attain $V_T$=0.6 V, ΔV must be proportionally greater.

Figure 3:
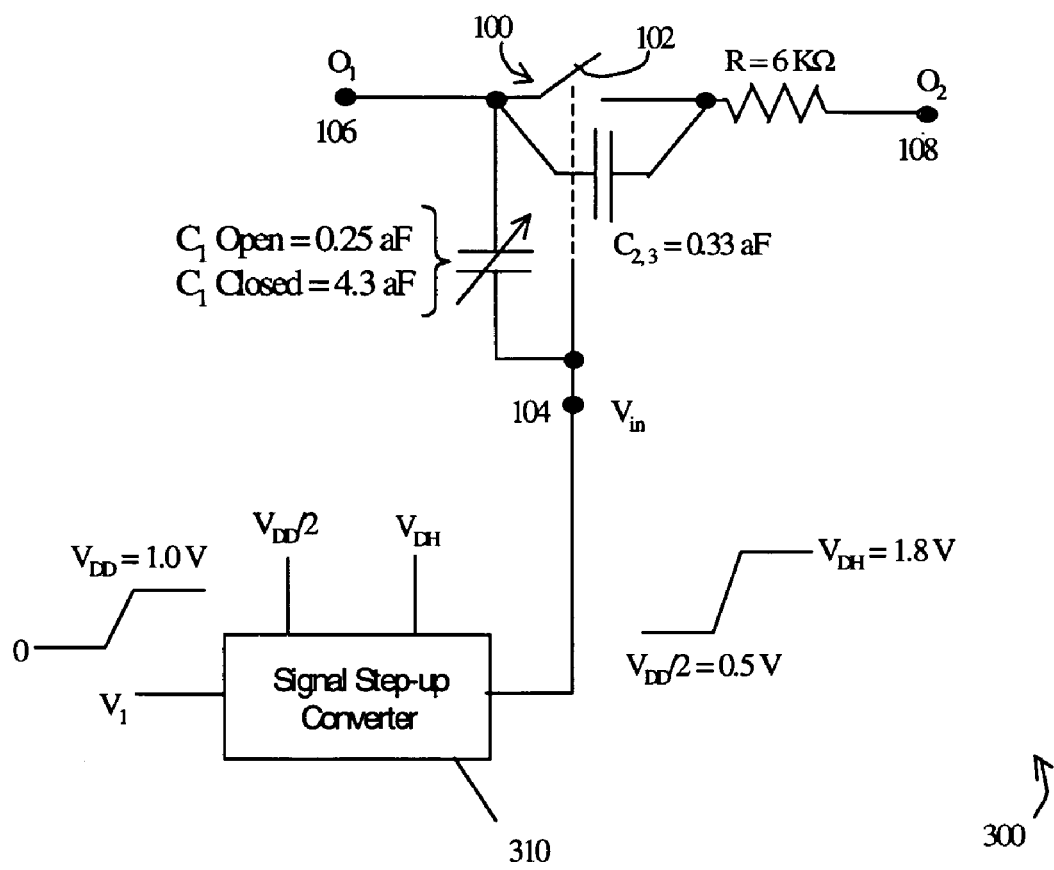
FIG. 3 is a schematic representation of a nanotube transfer device circuit according to an embodiment of the present invention.

FIG. 3 is a schematic illustration of a nanotube-based transfer device circuit 300. Transfer device circuit 300 includes nanotube switching element 100 and a voltage step-up converter 310. Voltage step-up converter shifts the input range of $V_{in}$ to the desired voltage range to ensure proper switching of nanotube switching element 100 when connected to arbitrary networks at output terminal 106 and output terminal 108. $V_{DD}$ is 1.0 V. The minimum $V_{in}$ is set to 0.5 V. The maximum $V_{in}$ must be sufficient to be 0.6 greater than $V_{NT}$, while factoring in coupling. Maximum $V_{in}$ is determined as follows.

By design of transfer device 100 and its components:

$V_{in}=V_{in}(min)+\Delta V;$ $V_{NT}(max)=1.0V+0.15\Delta V;$ and $V_{in}-V_{NT}(max)>=0.6V$ Solving for ΔV:

$(0.5+\Delta V)-(1.0V+0.15\Delta V)>=0.6V$ $0.85\Delta V>=1.1V$ $\Delta V>=1.3V$ For transfer device 100, $V_{in}(max)=1.8$ V. Voltage step-up converter 310 shifts $V_{in}$ to this range, 0.5 V<=$V_{in}$<=1.8 V. Voltage step-up converter can be implemented using any one of a variety of known techniques and circuit designs.

Nanotube switching element 100 switches OFF when $V_{in}$ falls to about 0.5 V. By that point, the potential difference between $V_{in}$ and $V_{NT}$ falls below $V_T$, or 0.6 V. The nanotube channel element 102 switches off due to the mechanical restoring forces.

Figure 4A:
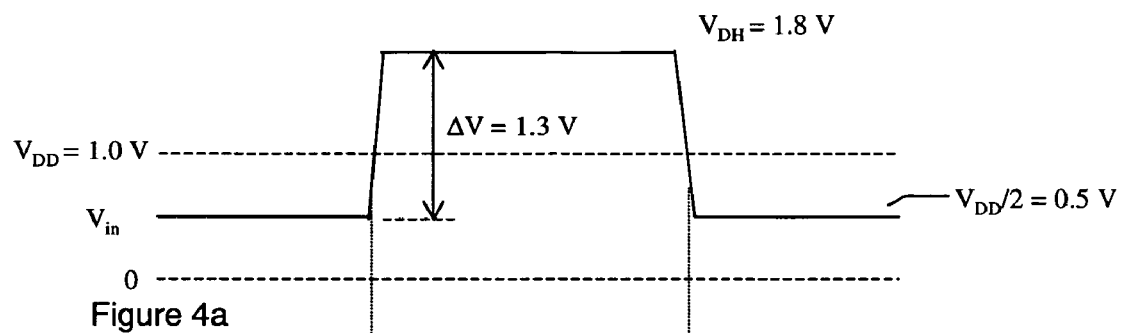
FIGS. 4a-c are graphs of operating voltages in the nanotube transfer device circuit of FIG. 3.
Figure 4B:
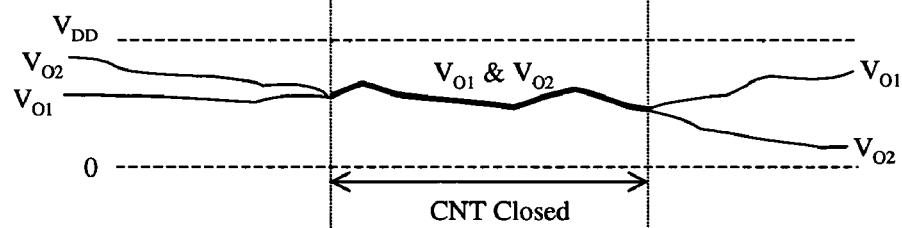
Figure 4C:
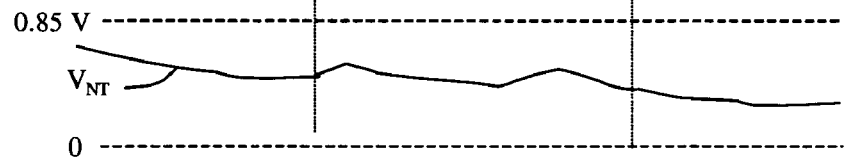

FIGS. 4a-c illustrate the respective voltages in transfer device 300 as it switches between the ON and OFF states. $V_{in}$ transitions from 0.5 V to 1.8 V back to 0.5 V. $V_{O1}$ and $V_{O2}$ are initially independent, determined by the respective networks they are connected to. When nanotube switching element 100 switches ON, the output electrodes 106 and 108 are connected by nanotube channel element 104 and are at approximately the same potential. There may be a small potential drop between the outputs 106 and 108 depending on the nanotube resistance. When nanotube channel element 102 is in the open position, the voltage capacitively coupled to the channel element 102 varies with changes in $V_{O1}$ and $V_{O2}$, with a maximum range of 0.85 volts determined by capacitance coupling ratios. $V_{O1}$ and $V_{O2}$ are not necessarily equal, and may vary in magnitude from 0 to 1.0 volts. When the channel element 102 is in the closed position, the channel element 102 forms the path between outputs $O_1$ and $O_2$;

therefore, $V_{O1}=V_{O2}=V_{NT}$, and can range in voltage from 0 to $V_{DD}=1.0$ V. The voltage waveforms are as illustrated in FIGS. 4a-4c.

Figure 5:
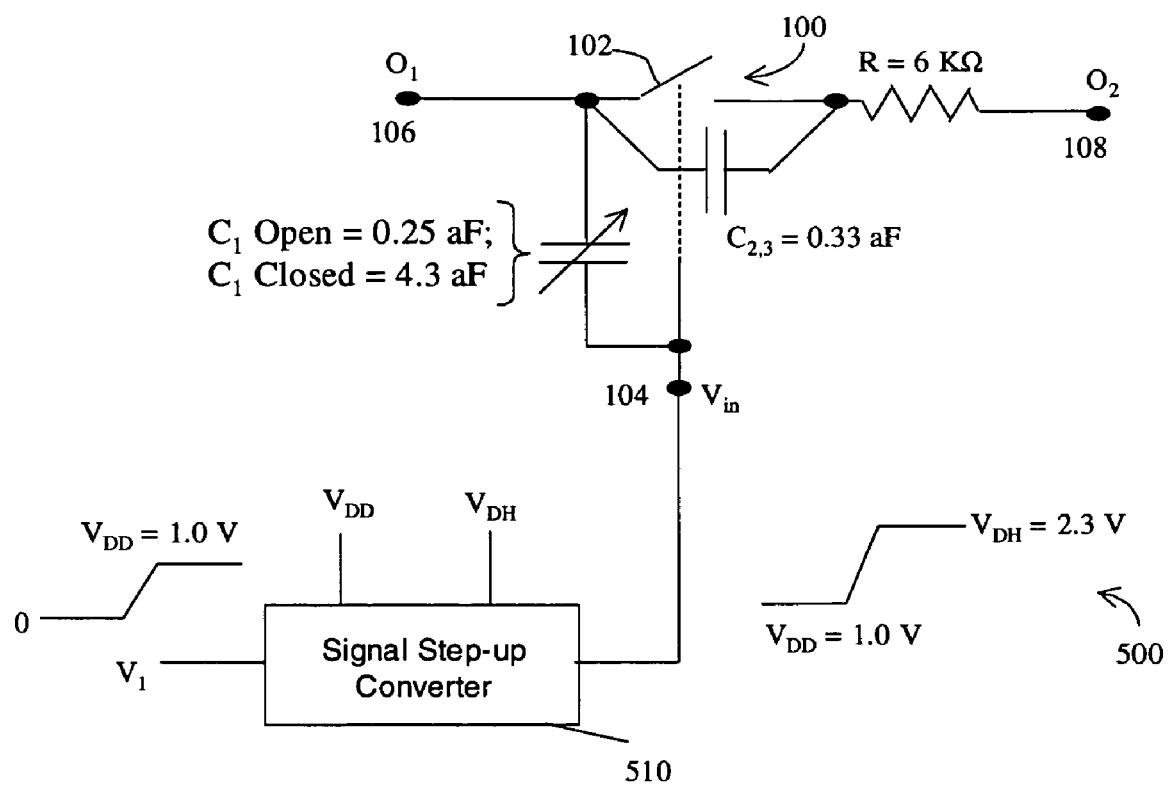
FIG. 5 is a schematic representation of a nanotube transfer device circuit according to an embodiment of the present invention.

FIG. 5 is a schematic representation of a nanotube-based transfer device circuit 500 according to another embodiment of the invention. In this embodiment, $V_{in}$(min)=1.0 V. Accordingly, $V_{in}$(max)=2.3 V.

FIGS. 6a-c illustrate the respective voltages in transfer device 500 as it switches between the ON and OFF states. $V_{in}$ transitions from 1.0 V to 2.5 V back to 1.0 V. The transfer device 500 is ON (or closed) only while $V_{in}$ is at its upper maximum value. When $V_{in}$ drops to its low value, the device turns OFF.

Figure 7A:
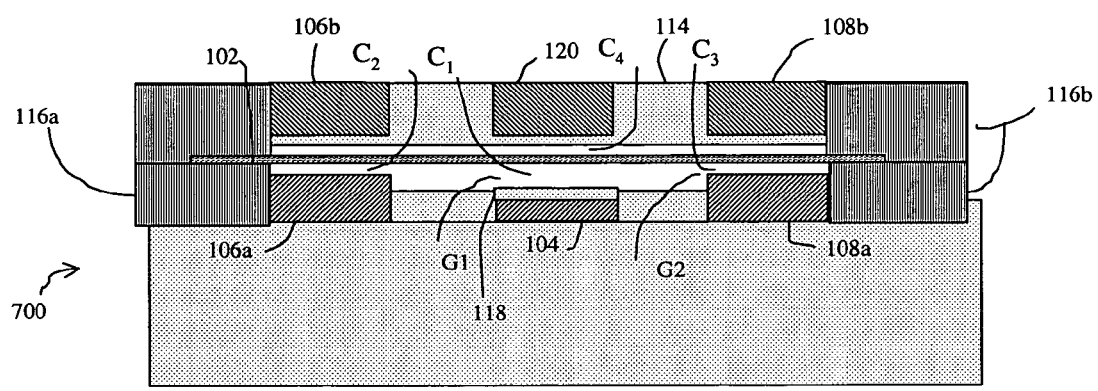
FIG. 7a is a side cross-sectional view of a nanotube transfer device according an embodiment of the present invention.

FIG. 7a illustrates a cross-sectional view of a four-terminal nonvolatile nanotube transfer device 700. In addition to the structures described above with respect to nanotube transfer device 100, nanotube transfer device 700 includes a release electrode 120 in the upper portion of the device. Release electrode 120 is covered by insulating layer 114 and isolated from mechanical contact with nanotube channel element 102. Control electrode 104 and release electrode 120 together form a control structure for transfer device 700. Control electrode 104 and release electrode 120 are used to control the switching operation of transfer device 700. Transfer device 700 is dimensioned to be a non-volatile device that retains its state even when power is interrupted or turned off. Release electrode 120 functions in a way similar to control electrode 104 but is preferably connected to a complementary control signal. When nanotube channel element 102 is deflected by a control signal $V_{in}$ provided on control electrode 104, nanotube channel element 102 will remain deflected even after the control signal returns to an OFF value or when power is interrupted, etc. To turn transfer device 700 to an OFF state, a second control signal $V_R$ provided on release electrode 120 induces deflection of nanotube channel element 102 away from the lower portion and output electrodes 106a and 108a and toward the upper portion, including output electrodes 106b and 108b and release electrode 120, all of which are insulated by dielectric layer 114. Consequently, activation of the release electrode 120 to a sufficient potential causes nanotube transfer device 700 to "reset" to the OFF state. In the non-volatile operating mode, a narrow input pulse of $V_{in}$ applied to control electrode 104 activates the transfer device, and van der Waals forces hold the transfer device in the closed position. A narrow pulse applied to release electrode 120 releases the transfer device. The transfer device does not require the activation voltage to remain on the input terminal. Since at any given time, the transfer device 700 should be in a known state ON or OFF, for correct operation of transfer device 700 in logical circuits, it is preferred that the control signal provided on release electrode 120 is complementary to the signal provided on control electrode 104. In switching network applications, however, the device may be turned OFF only when the network interconnections are reset; in this case, the release signal might not be complementary to the control signal at all times. For example, if control signal and release signals are both at the same voltage, ground (zero volts) for example, then the state of transfer device 700 remains unchanged (ON or OFF) independent of the values of output voltages $O_1$ and $O_2$.

Figure 7B:
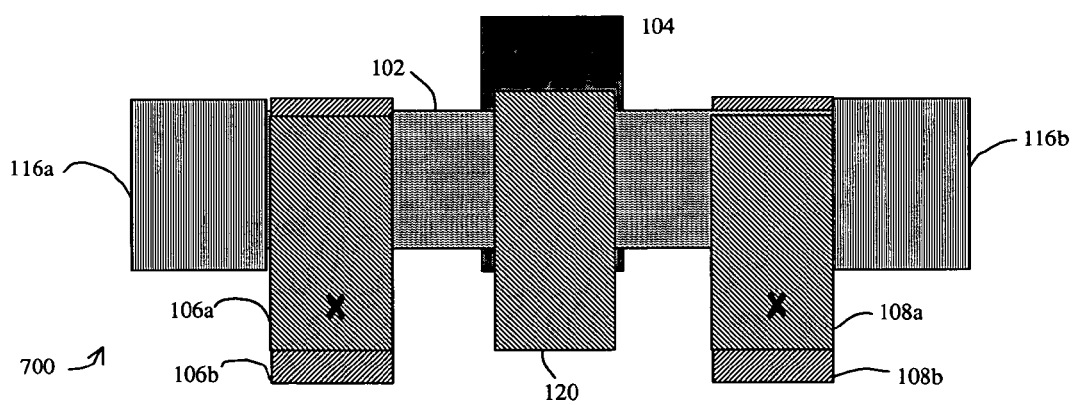
FIG. 7b is a top plan view or layout view of a nanotube transfer device according to an embodiment of the present invention.

FIG. 7b illustrates a layout view of the four-terminal nonvolatile nanotube switching element 700. As in device 100, in device 700, output electrodes 106a and 106b are electrically connected forming a first output node 106 and output electrodes 108a and 108b are also electrically connected forming a second output node 108.

FIG. 8a is a schematic representation of nanotube transfer device 700. Nanotube transfer device 700 is modeled in terms of equivalent resistances and capacitances. In the open or OFF state, nanotube transfer device 700 includes a first variable capacitance C1 between nanotube switching element 102 and control electrode 104, second capacitance C2 between nanotube switching element 102 and first output electrode 106a, third capacitance C3 between nanotube switching element 102 and second output electrode 108a, and fourth variable capacitance C4 between nanotube switching element 102 and release electrode 120. In the closed or ON state, nanotube transfer device 100 includes the capacitance C1, a first resistance R1 and a second resistance R2, and the capacitance C4. FIG. 8b is a transfer device equivalent circuit (schematic) derived from the schematic representation of FIG. 8a. FIG. 8c is a schematic, derived from the schematic of FIG. 8a, used to calculate the amount of input voltage coupled to the nanotube layer. Less than 10% of the input voltage couples to the nanotube channel element. FIG. 8d provides assumptions and exemplary values for the electrical parameters in FIGS. 8a, b, c, in one embodiment of the present invention. The calculations are also based on 10 nanotubes for each transfer device, and a fabric fill of 6% (void of 94%).

Figure 9:
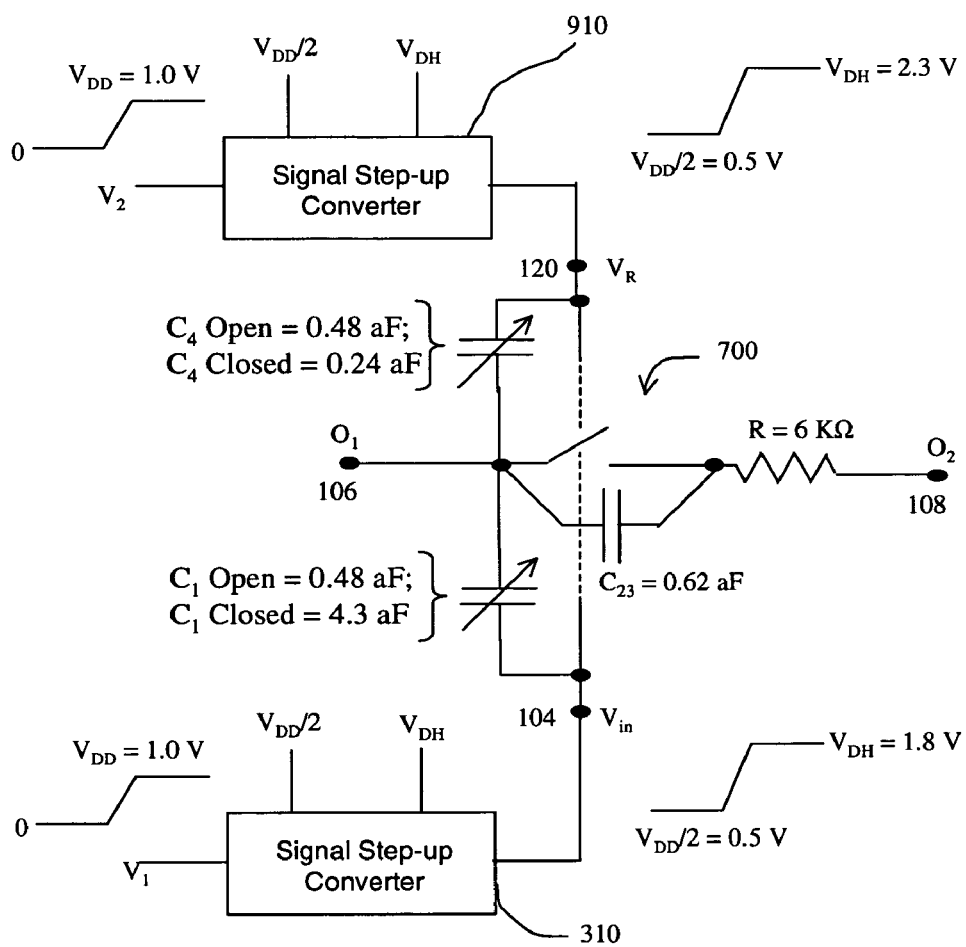
FIG. 9 is a schematic representation of a nanotube transfer device circuit according to an embodiment of the invention.

FIG. 9 illustrates a nanotube transfer device circuit 900 incorporating nanotube transfer device 700 and signal step-up circuitry to shift the control and release input signals $V_{in}$ and $V_R$ to a range where correct operation of nanotube transfer device 700 can be expected. Nanotube transfer device circuit 900 includes nanotube 700 (shown by its electrical equivalent representation) and a control signal step-up converter 310 and a release signal step-up converter 910. Operation of control signal step-up converter 310 has been described above. Release signal step-up converter 910 operates similarly with respect to a release signal provided to release electrode 120. Release signal step-up converter 910 shifts an input signal $V_R$ to an operating range wherein operation of nanotube transfer device 700 can be reliably controlled, and overdrives the release electrode 120 in order to ensure that nanotube channel element 102 is released and returns to an OFF state when the release signal is asserted, since the actual potential of nanotube channel element can vary from 0 V to $V_{DD}$. In the illustrated embodiment, release signal step-up converter 910 shifts the input signal from a range of 0 V to $V_{DD}$, to a range of 0.5 V to 1.8 V.

Figure 10A:
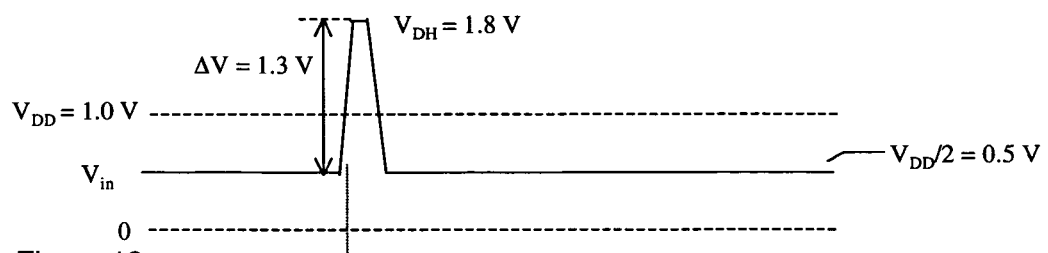
FIGS. 10a-d are graphs of operating voltage in the nanotube transfer device circuit of FIG. 9.
Figure 10B:
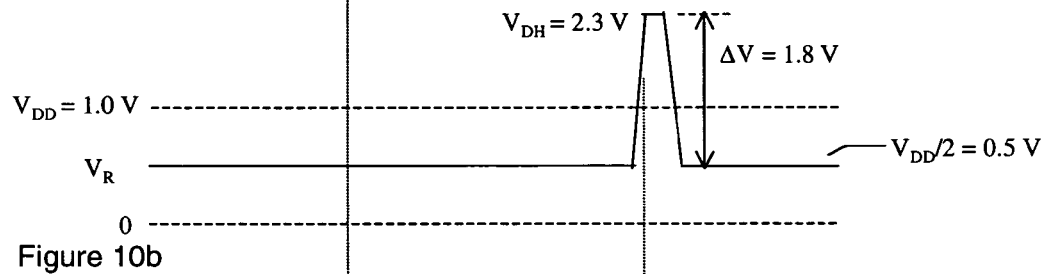
Figure 10C:
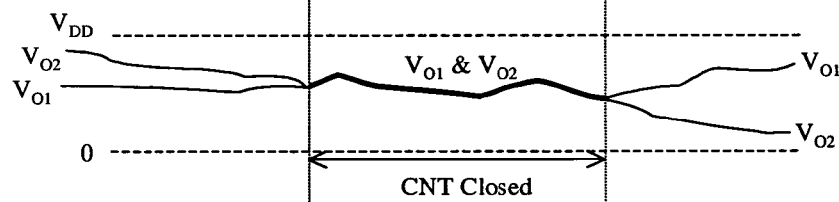
Figure 10D:
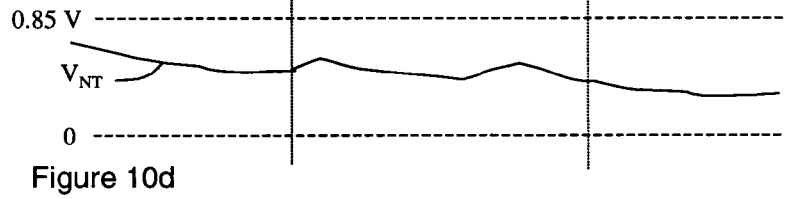

FIG. 10a illustrates input pulse of $V_{in}$ applied to activate (close) the nanotube transfer device 700, with a voltage swing of $\Delta V=1.3$ volts. FIG. 10b illustrates pulse of $V_R$ applied to de-activate (open) the transfer device. The release voltage is assumed to be larger than the activation voltage, with a voltage swing of $\Delta V=1.3$ volts. FIGS. 10c and 10d illustrate waveforms that are the same as those of FIGS. 3b and 3c, respectively.

Figure 11:
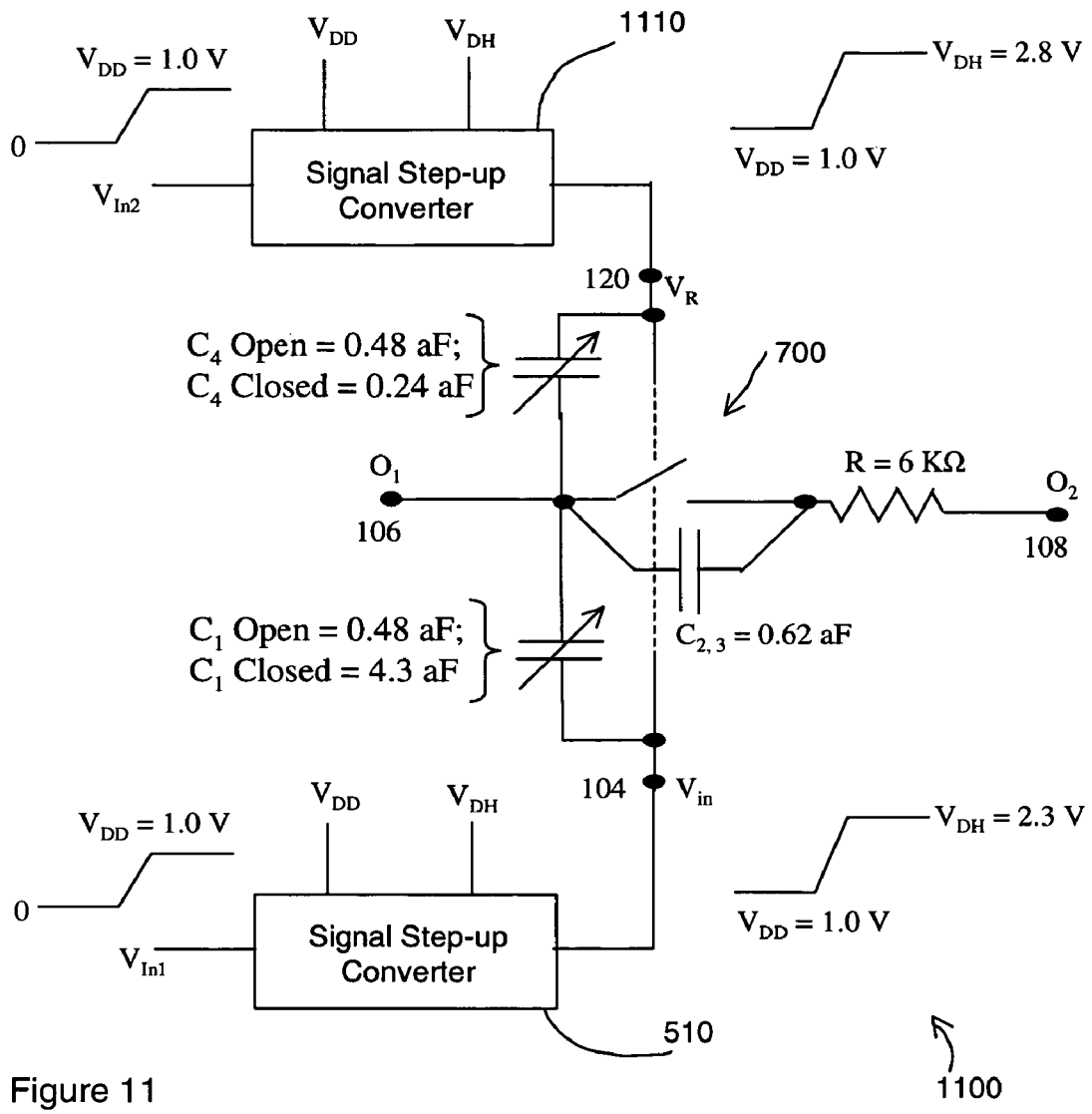
FIG. 11 is a schematic representation of a nanotube transfer device circuit according to an embodiment of the invention.

FIG. 11 illustrates a nanotube transfer device circuit 1100 as in FIG. 9, except that the reference voltage of the signal step-up converter 510 is $V_{DD}=1.0$ volts. The voltage output swing remains $\Delta V=1.3$ V applied to terminal 1 when activating (closing) the transfer device, and $\Delta V=1.3$ V when releasing (opening) the transfer device. However, the maximum voltages increase because of the higher 1.0 V reference voltage to signal step-up converter 510. Signal step-up converter 1110 here has an output range of 1.0 V to 2.3 V.

FIG. 12a illustrates $V_{in}$ applied to activate (close) the transfer device 700 in circuit 1100, with a voltage swing of $\Delta V=1.3$ volts. FIG. 12b illustrates $V_R$ applied to de-activate (open) the transfer device 700. FIGS. 12c and 12d waveforms are the same as those of FIGS. 10c and 10d respectively.

The voltage step-up technique described herein may also be applied to other nanotube-based switch architectures. Providing signal conditioning circuitry to shift the operating range of one or more control signals ensures that the desired state of channel formation is attained regardless of the electrical potential of the nanotube channel element (within its operating range). This technique enables coupling of arbitrary, variable signals to a transfer node of a nanotube-based switching device, while maintaining desired switching characteristics. This technique may also be applied, for example, to the devices disclosed in application Ser. Nos. 10/917,794 and 10/918,085, which are incorporated herein by reference.

Devices 100, 700 can be used to implement a wide variety of circuits, logic circuits, memory circuits, etc. It is contemplated that devices 100, 700 can be used to replace MOS field effect transfer devices and can be used on a single substrate integrated with MOS technology or in pure nanotube-based logic (nanologic) designs. The examples given herein are based on a projected 90 nm technology node, however, it will be appreciated that other technologies are within the scope of the present invention. The transfer device according to aspects of the invention can be used in many applications. For example, it could be used to construct an NRAM memory array of very small cell size. When used in such a non-volatile memory array, it is possible to layout a less than 8 $F^2$ cell with bit selectivity for the read, release, and write operations. There are many other applications because the transfer device 100, 700 is such a versatile active electrical element. For example, such transfer devices 100, 700 in product chips can be used to repeatedly change on-chip generated timings and voltages after fabrication at the wafer level, or after chip assembly at the module, card, or system level. This can be done at the factory, or remotely in field locations. Such usage can enhance product yield, lower power, improve performance, and enhance reliability in a wide variety of products. Devices 100 and 700 may also be used to interconnect various networks as well.

The following are assigned to the assignee of this application, and are hereby incorporated by reference in their entirety:

Electromechanical Memory Having Cell Selection Circuitry Constructed With Nanotube Technology (U.S. Pat. No. 6,643,165), filed on Jul. 25, 2001;

Electromechanical Memory Array Using Nanotube Ribbons and Method for Making Same (U.S. patent application Ser. No. 09/915,093), filed on Jul. 25, 2001;

Hybrid Circuit Having Nanotube Electromechanical Memory (U.S. Pat. No. 6,574,130), filed on Jul. 25, 2001;

Electromechanical Three-Trace Junction Devices (U.S. patent application Ser. No. 10/033,323), filed on Dec. 28, 2001;

Methods of Making Electromechanical Three-Trace Junction Devices (U.S. patent application Ser. No. 10/033,032), filed on Dec. 28, 2001;

Nanotube Films and Articles (U.S. Pat. No. 6,706,402), filed Apr. 23, 2002;

Methods of Nanotube Films and Articles (U.S. patent application Ser. No. 10/128,117), filed Apr. 23, 2002;

Methods of Making Carbon Nanotube Films, Layers, Fabrics, Ribbons, Elements and Articles (U.S. patent application Ser. No. 10/341,005), filed on Jan. 13, 2003;

Methods of Using Thin Metal Layers to Make Carbon Nanotube Films, Layers, Fabrics, Ribbons, Elements and Articles (U.S. patent application Ser. No. 10/341,055), filed Jan. 13, 2003;

Methods of Using Pre-formed Nanotubes to Make Carbon Nanotube Films, Layers, Fabrics, Ribbons, Elements and Articles (U.S. patent application Ser. No. 10/341,054), filed Jan. 13, 2003;

Carbon Nanotube Films, Layers, Fabrics, Ribbons, Elements and Articles (U.S. patent application Ser. No. 10/341,130), filed Jan. 13, 2003;

Electro-Mechanical Switches and Memory Cells Using Horizontally-Disposed Nanofabric Articles and Methods of Making the Same, (U.S. Provisional Pat. Apl. Ser. No. 60/446,783), filed Feb. 12, 2003; now Devices Having Horizontally-Disposed Nanofabric Articles and Methods of Making the Same (U.S. patent application Ser. No. 10/776,059), filed Feb. 11, 2004;

Electromechanical Switches and Memory Cells using Vertically-Disposed Nanofabric Articles and Methods of Making the Same (U.S. Provisional Pat. Apl. Ser. No. 60/446,786), filed Feb. 12, 2003; now Devices Having Vertically-Disposed Nanofabric Articles and Methods of Making the Same (U.S. patent application Ser. No. 10/776,572), filed Feb. 11, 2004.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A nanotube transfer device, comprising:
a first output node connected to a first network;
a second output node connected to a second network;
a nanotube channel element including at least one electrically conductive nanotube, each end of said nanotube channel element being pinned in a fixed position by an insulating structure, said nanotube channel element being electrically isolated by the insulating structure and not in physical contact with either of said first output node or said second output node thereby forming an OFF state of the device; and
a control structure having one control electrode disposed in relation to the nanotube channel element to controllably form an electrically conductive channel between said first output node and said second output node through said nanotube channel element, thereby forming an ON state of the device wherein an arbitrary signal is transferred between said first output node and said second output node;
wherein the OFF state of the device is effectuated by the nanotube channel element having a first operating voltage range and wherein the ON state of the device is effectuated only by the control electrode having a second operating voltage range, and wherein an upper operating voltage of said second operating voltage range exceeds an upper operating voltage of said first operating range by at least an amount sufficient to form the electrically conductive channel.

2. The device of claim 1, wherein when said nanotube channel element is electrically isolated in the OFF state of the device, said nanotube channel element has a floating potential.

3. The device of claim 1, wherein said control structure is arranged in relation to the nanotube channel element to form said conductive channel by causing electromechanical deflection of said nanotube channel element in the ON state of the device.

4. The device of claim 3, wherein the electromechanical deflection causes the nanotube channel element to electrically contact a first output electrode in said first output node and a second output electrode in said second output node in the ON state of the device.

5. The device of claim 1, wherein each of said first output node and said second output node includes an isolation structure disposed in relation to the nanotube channel element so that the ON state of the device comprises controllably forming the electrically conductive channel substantially independently from electrical stimulus on each of said first output node and said second output node.

6. The device of claim 5, wherein each of said first and second output nodes comprises a lower electrode disposed below the nanotube channel element and said isolation structure includes upper electrodes disposed above the nanotube channel element, and said upper and lower electrodes produce substantially equal but opposite electrostatic forces on the nanotube channel element, the forces substantially undisturbed by the ON state and the OFF state of the device.

7. The device of claim 6, wherein at least one of said isolation structure electrodes is electrically insulated from said nanotube channel element by an insulator.

8. The device of claim 6, wherein said isolation structure electrodes are in low resistance electrical communication with said lower electrodes.

9. The device of claim 1, wherein said nanotube channel element is suspended between insulative supports in spaced relation relative to the control electrode and wherein deflection of said nanotube channel element in the ON state is in response to electrostatic attractive forces resulting from signals on the control electrode and is substantially independent of signals on the first output node or the second output node.

10. The device of claim 1, wherein said nanotube channel element comprises nanofabric.

11. The device of claim 1, wherein said control electrode is electrically isolated from said nanotube channel element by an insulator.

12. The device of claim 1, wherein said nanotube channel element is constructed and arranged to deflect in the ON state and to remain deflected in the OFF state.

13. The device of claim 1, wherein said nanotube channel element is constructed and arranged to deflect in the ON state and to return to an undeflected position in the OFF state.

14. The device of claim 1, wherein each of the first and second output nodes includes an upper and lower output electrode pair in electrical communication with one another, the upper and lower output electrodes of each upper and lower output electrode pair being disposed above and below the nanotube channel element, respectively.

15. The device of claim 1, the control structure including a second control electrode, the control electrode and second control electrode being disposed in relation to the nanotube channel element to controllably form the electrically conductive channel between the first output node and the second output node, the control electrode and the second control electrode being positioned on opposite sides of the nanotube channel element.

16. A transfer device circuit, comprising:
    a nanotube transfer device, including a first node, a second node, a nanotube channel element including at least one electrically conductive nanotube, and a control structure disposed in relation to the nanotube channel element; and
    a signal shaping circuit electrically coupled to said control structure, said signal shaping circuit receiving an input signal and providing a control signal representative of said input signal to the control structure,
    wherein each end of said nanotube channel element is pinned in a fixed position by an insulating structure, and wherein the nanotube channel element controllably forms an electrically conductive channel and transfers an arbitrary signal between said first node and said second node in response to a first value of said control signal at only said control structure, regardless of an electrical potential of the nanotube channel element; and
    wherein the nanotube channel element unforms the electrically conductive channel in response to a second value of said control signal at only said control structure such that the nanotube channel element is electrically isolated by the insulating structure, the nanotube channel element not in contact with either of said first and second nodes.

17. The circuit of claim 16, wherein said signal shaping circuit overdrives said first value of the control signal to a voltage above a supply voltage.

18. The circuit of claim 16, wherein the second value of said control signal ensures the absence of channel formation regardless of an electrical potential of the nanotube channel element.

19. The circuit of claim 16, wherein said signal shaping circuit shifts said input signal from a first range to a second range to provide the first control signal, wherein the channel predictably forms at endpoints of the second range.

20. The circuit of claim 16, wherein said control structure includes a first control electrode and a second control electrode disposed on opposite sides of the nanotube channel element, the first value of the control signal being provided to the first control electrode, further comprising a second signal shaping circuit electrically coupled to said control structure, said second signal shaping circuit receiving a second input signal and providing the second value of the control signal to the second control electrode.

\* \* \* \* \*

UNITED STATES PATENT AND TRADEMARK OFFICE
CERTIFICATE OF CORRECTION

PATENT NO. : 7,652,342 B2  Page 1 of 1
APPLICATION NO. : 11/033087
DATED : January 26, 2010
INVENTOR(S) : Claude L. Bertin It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 447 days.

Signed and Sealed this

Fourth Day of January, 2011

David J. Kappos
*Director of the United States Patent and Trademark Office*